(12) United States Patent
Gotoda et al.

(10) Patent No.: US 9,762,029 B2
(45) Date of Patent: Sep. 12, 2017

(54) SEMICONDUCTOR LASER AND OPTICAL INTEGRATED LIGHT SOURCE INCLUDING THE SAME

(71) Applicant: Mitsubishi Electric Corporation, Chiyoda-ku (JP)

(72) Inventors: Mitsunobu Gotoda, Tokyo (JP); Masakazu Takabayashi, Toyko (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 61 days.

(21) Appl. No.: 14/865,911

(22) Filed: Sep. 25, 2015

(65) Prior Publication Data
US 2016/0149379 A1  May 26, 2016

(30) Foreign Application Priority Data

Sep. 30, 2014 (JP) ................... 2014-199798
Jul. 30, 2015 (JP) ................... 2015-150484

(51) Int. Cl.
*H01S 5/12* (2006.01)
*H01S 5/40* (2006.01)
(Continued)

(52) U.S. Cl.
CPC ............ *H01S 5/124* (2013.01); *H01S 5/0265* (2013.01); *H01S 5/0425* (2013.01); *H01S 5/026* (2013.01);
(Continued)

(58) Field of Classification Search
CPC ............................... H01S 5/124; H01S 5/1246
See application file for complete search history.

(56) References Cited

U.S. PATENT DOCUMENTS

| 6,574,259 B1 * | 6/2003 | Fish | H01S 5/06256 372/50.1 |
| 8,705,583 B2 * | 4/2014 | Matsuda | B82Y 20/00 372/46.01 |
| 2012/0207187 A1 * | 8/2012 | Hasegawa | H01S 5/4087 372/50.1 |

FOREIGN PATENT DOCUMENTS

| JP | 63-062390 | 3/1988 |
| JP | 01-187890 | 7/1989 |

(Continued)

OTHER PUBLICATIONS

Shim et al., "Lasing Characteristics of 1.5 μm GaInAsP—InP SCH-BIG-DR Lasers," Jun. 1991, IEEE Journal of Quantum Electronics, vol. 27, No. 6, pp. 1736-1745.*

*Primary Examiner* — Michael Carter
(74) *Attorney, Agent, or Firm* — Oblon, McClelland, Maier & Neustadt, L.L.P.

(57) ABSTRACT

A semiconductor laser according to the present invention includes an active layer, a guide layer laminated on the active layer, a diffraction grating formed along a light emission direction in the guide layer, an upper electrode provided above the guide layer, and a lower electrode provided below the active layer. The diffraction grating includes a current-injection diffraction grating and current-non-injection diffraction gratings provided both in front of and in back of the current-injection diffraction grating. Phase shifters are individually provided at a central portion of the current-injection diffraction grating and at boundaries between the current-injection diffraction grating and the current-non-injection diffraction gratings. The upper electrode is provided above the current-injection diffraction grating and is not provided above the current-non-injection diffraction gratings.

9 Claims, 26 Drawing Sheets

(51) Int. Cl.
*H01S 5/042* (2006.01)
*H01S 5/026* (2006.01)
*H01S 5/028* (2006.01)
*H01S 5/50* (2006.01)

(52) U.S. Cl.
CPC .......... *H01S 5/0268* (2013.01); *H01S 5/0287* (2013.01); *H01S 5/4087* (2013.01); *H01S 5/50* (2013.01)

(56) References Cited

FOREIGN PATENT DOCUMENTS

| | | |
|---|---|---|
| JP | 05-048214 | 2/1993 |
| JP | 2003-258368 | 9/2003 |

\* cited by examiner

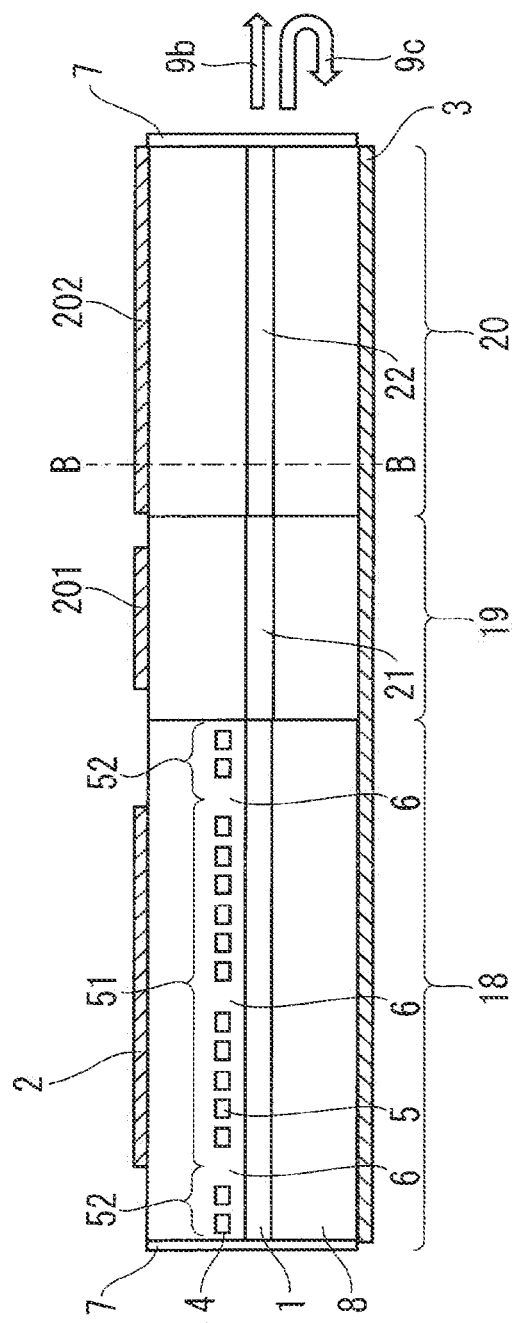

SEMICONDUCTOR LASER AND OPTICAL INTEGRATED LIGHT SOURCE INCLUDING THE SAME

BACKGROUND OF THE INVENTION

Field of the Invention

The present invention relates to a semiconductor laser and an optical integrated light source including the same, and for example, relates to a distributed feedback semiconductor laser.

Background Art

In response to rapidly increasing demands for communications, a wavelength division multiplexing communication system has recently been achieved. This system multiplexes a plurality of signal lights having different wavelengths, thereby enabling high-capacity transmission with a single optical fiber.

The light source for a wavelength division multiplexing communication system is preferably a single-mode laser diode, or, LD (hereinafter, referred to as a single-mode LD), which can have a high side mode suppression ratio (SMSR) of at least 30 to 40 dB or higher. A typical example of the single-mode LD is a distributed feedback laser diode (hereinafter, referred to as DFB-LD) that determines an oscillation wavelength using a diffraction grating provided in a semiconductor chip in its longitudinal direction adjacent to an active layer.

The DFB-LD selects, in accordance with the reflectance asymmetry or reflectance phase on a cleaved end surface, any one of the two oscillation modes in the vicinity of the Bragg wavelength determined by a diffraction grating period. Then, the selected mode is set as a single-mode LD. However, due to variations in threshold current and slope efficiency, a sufficiently high single-mode yield cannot be obtained.

Under the circumstances, a $\lambda/4$ phase shift DFB-LD is used which has front and rear cleaved end surfaces covered with anti-reflection coatings and has, at the central portion of the diffraction grating, a phase shift region (phase shifter) for shifting a diffraction grating phase by $\pi$. The method using such a $\lambda/4$ phase shift DFB-LD excites only one oscillation mode that matches the Bragg wavelength in principle, leading to a high single-mode yield.

Putting a wavelength division multiplexing communication system to practical use requires a wavelength tunable light source that can cover all wavelength bands and can be manufactured at low cost. There is known a monolithic integrated type wavelength tunable light source that is configured as follows (for example, see Japanese Patent Application Laid-Open No. 2003-258368). The light source includes a plurality of $\lambda/4$ phase shift DFB-LDs integrated into an array on the same substrate, in which the output sides of the LDs are connected to an input waveguide of a multimode interference type optical multiplexing circuit (hereinafter, referred to as MMI), and the lights multiplexed by the MMI are output through an output waveguide. Hereinafter, the MMI having K (K is a natural number) inputs and L (L is a natural number) outputs is represented by K×L–MMI.

Also, research has been done on monolithically integrating a $\lambda/4$ phase shift DFB-LD and a wavelength tunable light source with a Mach Zehnder (MZ) optical modulator and an electro absorption (EA) optical modulator on the same substrate.

For the wavelength division multiplexing communication system having a transmission rate of 40 Gbps or higher for a trunk line, digital coherent communications employing optical phase modulation have recently been put to practical use. The digital coherent communications require a narrow-linewidth laser light source having a laser linewidth of 1 MHz or less, more desirably, 500 kHz or less.

Unfortunately, in a single $\lambda/4$ phase shift DFB-LD, which has both end surfaces covered with anti-reflection coatings, the reflected return light from the outside of an LD resonator is apt to enter the inside of the active layer of the LD. Thus, an optical isolator needs to be provided at the output in the front of the $\lambda/4$ phase shift DFB-LD. Also, a measure against the reflected return light from the output side in back of the DFB-LD needs to be taken, limiting the flexibility in module design. If a to-be-injected current is increased for higher output, the return light itself, caused by the residual reflection on the end surface, becomes a problem.

An optical integrated device cannot include an optical isolator, and thus, inevitably suffers from the return of the reflected return light, which comes from the butt joint interface that directly bonds the waveguides formed of different epitaxial films, the output end surface, or the like, to the inside of the LD active layer.

As described above, a single $\lambda/4$ phase shift DFB-LD and an optical integrated device including the same may suffer from the following problem. Depending on the phase of return light, return-light-induced noise may be caused so that the LD linewidth increases, or a single mode oscillation may be impeded so that the SMSR decreases to 30 dB or lower.

To solve the problem above, for example, Japanese Patent Application Laid-Open No. 63-62390 (1988) proposes that first and second Bragg reflection regions be provided to the both sides of the laser light emission region including a diffraction grating. The first and second Bragg reflection regions include successive different gratings having the same phase and always have a gain in an optical wavelength, which is not more than zero. This configuration allows part of the return light to be reflected, achieving a semiconductor laser that has less return-light-induced noise than a conventional $\lambda/4$ phase shift DFB-LD and that produces a single-mode oscillation at a probability substantially identical to a conventional probability.

According to Japanese Patent Application Laid-Open No. 63-62390 (1988), unfortunately, an optical loss in a current injection region having an amplification factor of not more than zero is large because of the long length of this region, increasing threshold current and power consumption. In addition, as described below, an effect obtained by reducing the influence of the return light is not stabilized because the light intensity distribution in the laser resonator varies depending on the phase of the reflected return light.

For a $\lambda/4$ phase shift DFB-LD having a resonator length (L) of approximately 300 μm, the product ($\kappa \times L$) of the coupling coefficient ($\kappa$) of the diffraction grating and the diffraction grating length (L) of the LD is normally set to approximately 1.2. To obtain a narrow-linewidth laser light source of 500 kHz or less, L needs to be 1000 μm or more to increase $\kappa \times L$. This, however, may lead to multiple modes due to the influence of the reflected return light.

SUMMARY OF THE INVENTION

The present invention has an object to provide a semiconductor laser capable of stably keeping a single-mode oscillation regardless of the phase of reflected return light, thereby preventing a decrease in SMSR and an increase in laser linewidth, and also provide an optical integrated light source including the semiconductor laser.

A semiconductor laser according to the present invention includes an active layer, a guide layer laminated on the active layer, a diffraction grating formed along a light emission direction in the guide layer, an upper electrode provided above the guide layer, and a lower electrode provided below the active layer. The diffraction grating includes a current-injection diffraction grating and current-non-injection diffraction gratings provided both in front of and in back of the current-injection diffraction grating. Phase shifters are individually provided at a central portion of the current-injection diffraction grating and at boundaries between the current-injection diffraction grating and the current-non-injection diffraction gratings. The upper electrode is provided above the current-injection diffraction grating and is not provided above the current-non-injection diffraction gratings.

The semiconductor laser according to the present invention is less affected by the reflected return light than a conventional semiconductor laser. Thus, a single-mode semiconductor laser whose SMSR does not decrease regardless of the phase or the intensity of the reflected return light can be achieved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a cross-sectional view of an optical integrated device according to a second preferred embodiment;

DESCRIPTION OF THE PREFERRED EMBODIMENTS

<Prerequisite Technology>

Figure 19:
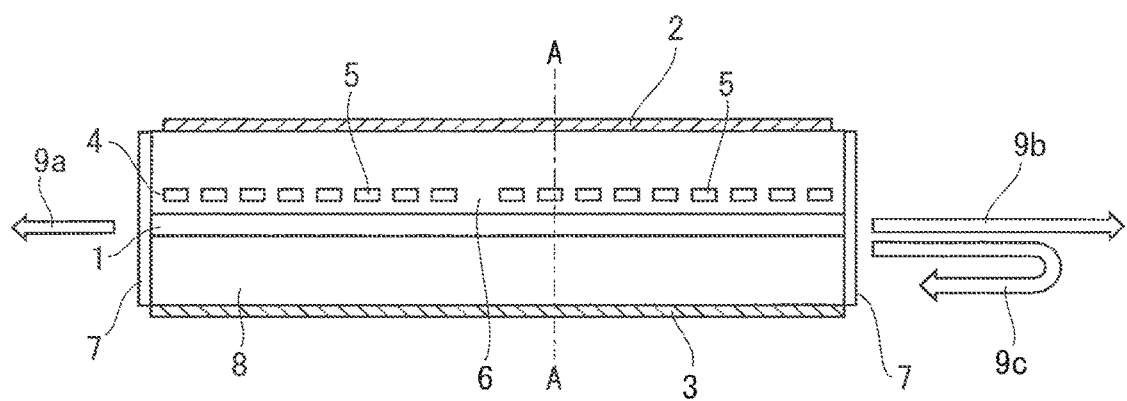
FIG. 19 is a cross-sectional view of a semiconductor laser according to the prerequisite technology.

The technology on which the present invention is based is described prior to the description of the preferred embodiments. FIG. 19 is a cross-sectional view showing an example configuration of a semiconductor laser (that is, λ/4 phase shift DFB-LD) of the prerequisite technology. FIG. 19 simply shows the laminated structure of a semiconductor.

As shown in FIG. 19, carriers are injected into an active layer 1 laminated on a semiconductor substrate 8 through an upper electrode 2 and a lower electrode 3, and then, the carriers are excited. This produces a gain, thereby generating spontaneous emission light. A guide layer 4 adjacent to the active layer 1 has a band gap that does not absorb the excited light. In the guide layer 4 is formed a diffraction grating 5 and, at the central portion of the diffraction grating 5 in the longitudinal direction, a phase shifter 6 corresponding to λ/4 is provided. Both end surfaces of the semiconductor laser are cleaved, and the cleaved end surfaces are covered with anti-reflection coatings 7.

Part of the spontaneous emission light generated in the active layer 1 is reflected at the Bragg wavelength determined by the period of the diffraction grating 5 and then turns into seed light in stimulated emission. When threshold conditions are satisfied, laser oscillation is generated. The λ/4 phase shift DFB-LD emits nearly equal amounts of a front output light 9b and a rear output light 9a to the outside of a resonator. Part of the output light returns to the active layer 1 as a reflected return light 9c from an outside reflection point such as a surface of an optic or an optical fiber connector, or from the end surface of the semiconductor laser.

Figure 20:
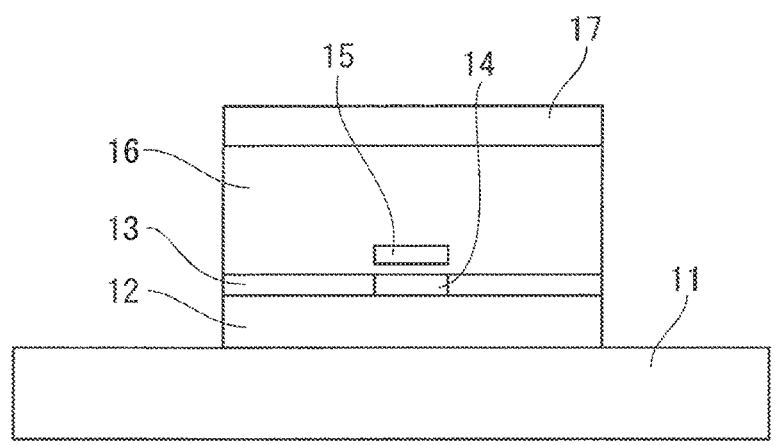
FIG. 20 is a cross-sectional view of the semiconductor laser according to the prerequisite technology, seen from an emission direction.
Figure 21A:
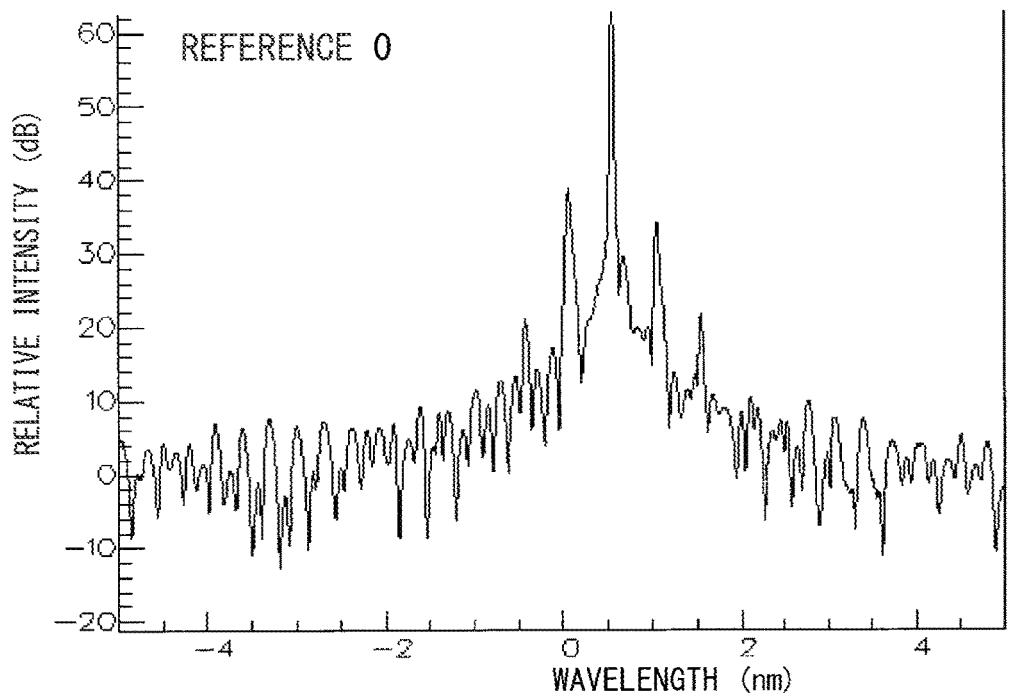
FIGS. 21A, 22B, 22A, 22B, 23A, 23B, 24A, and 24B show the dependence of oscillation characteristics on the phase of an end surface in the presence of reflections from both end surfaces in the semiconductor laser according to the prerequisite technology.
Figure 21B:
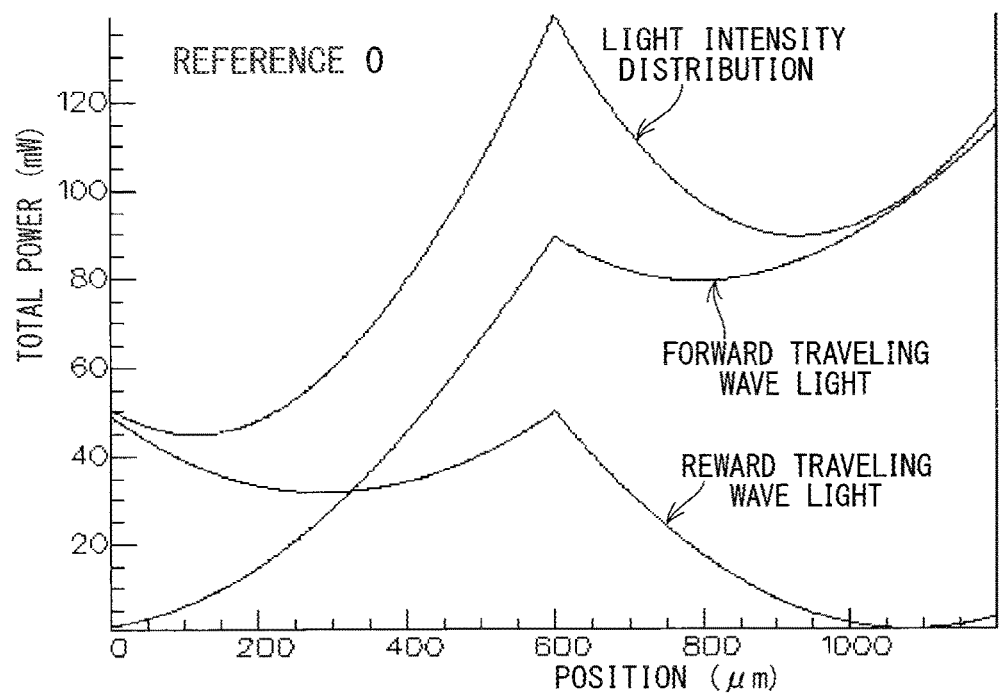
Figure 22A:
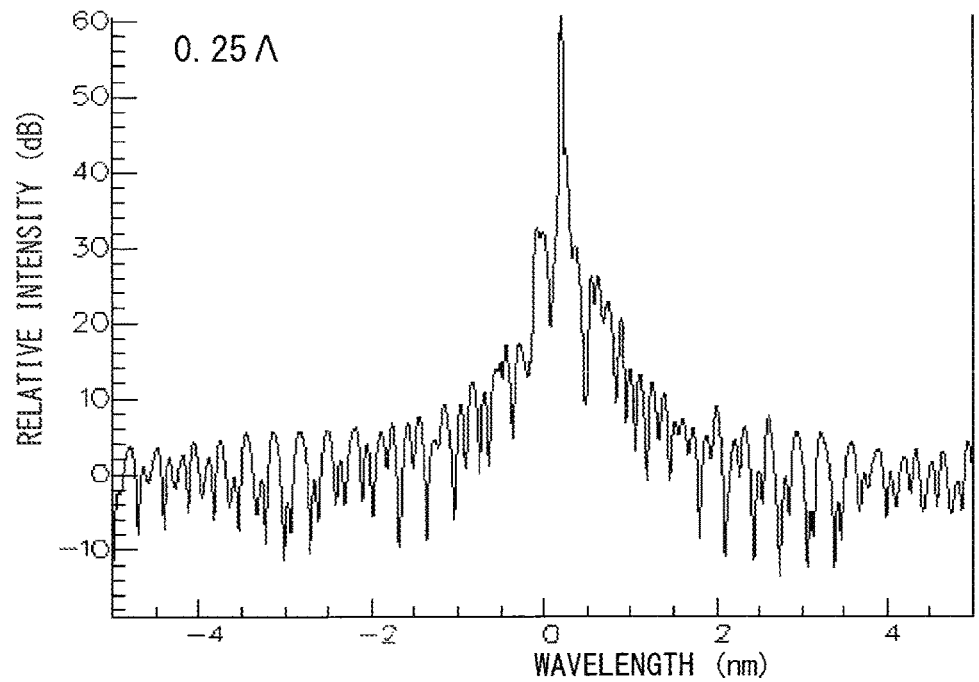
Figure 22B:
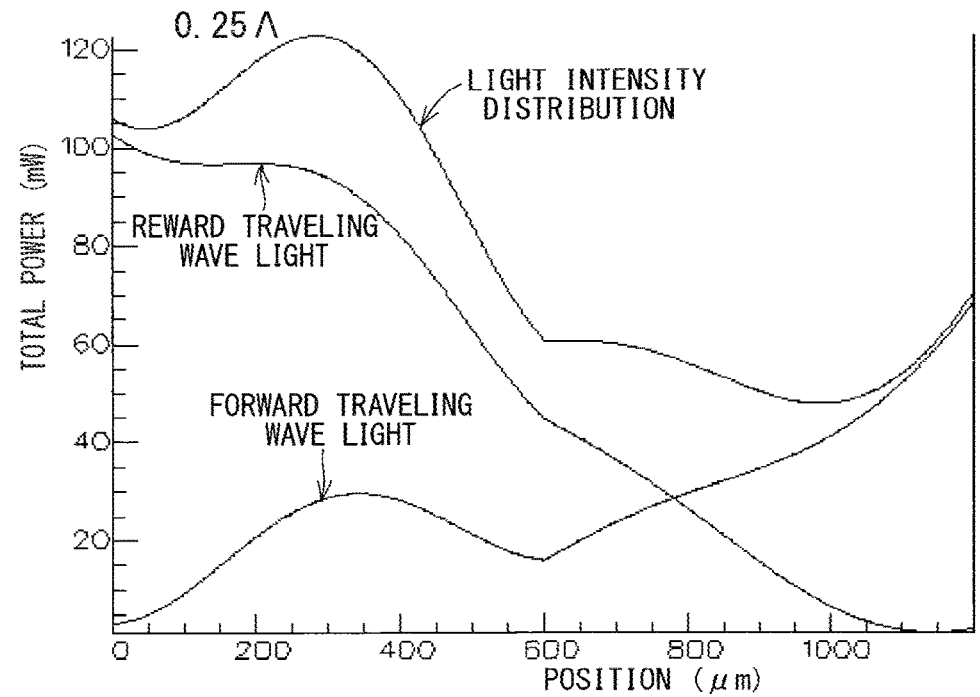
Figure 23A:
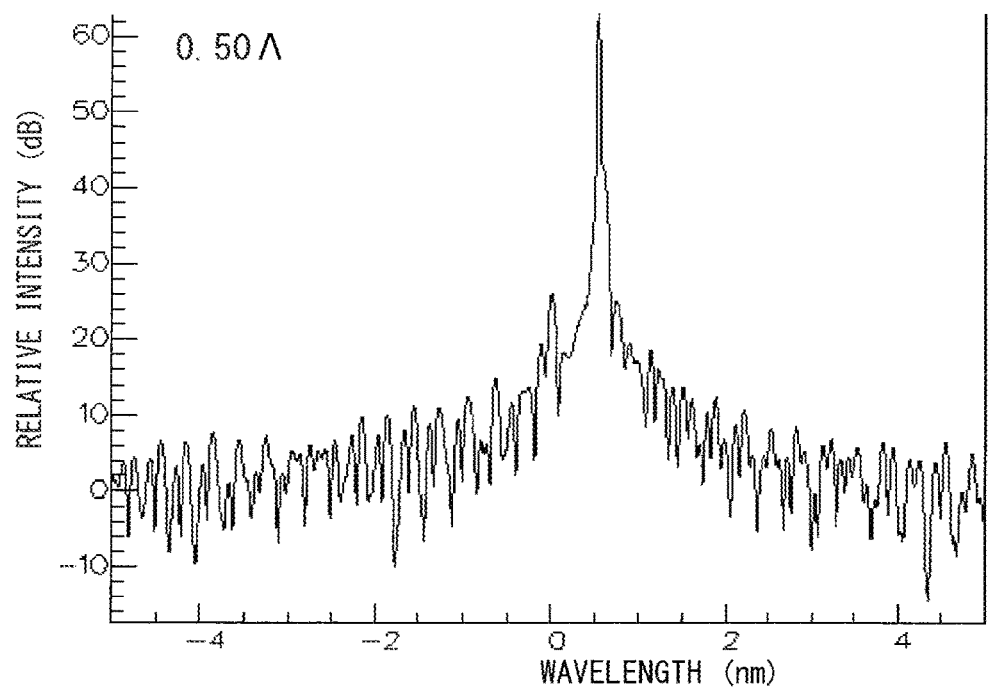
Figure 23B:
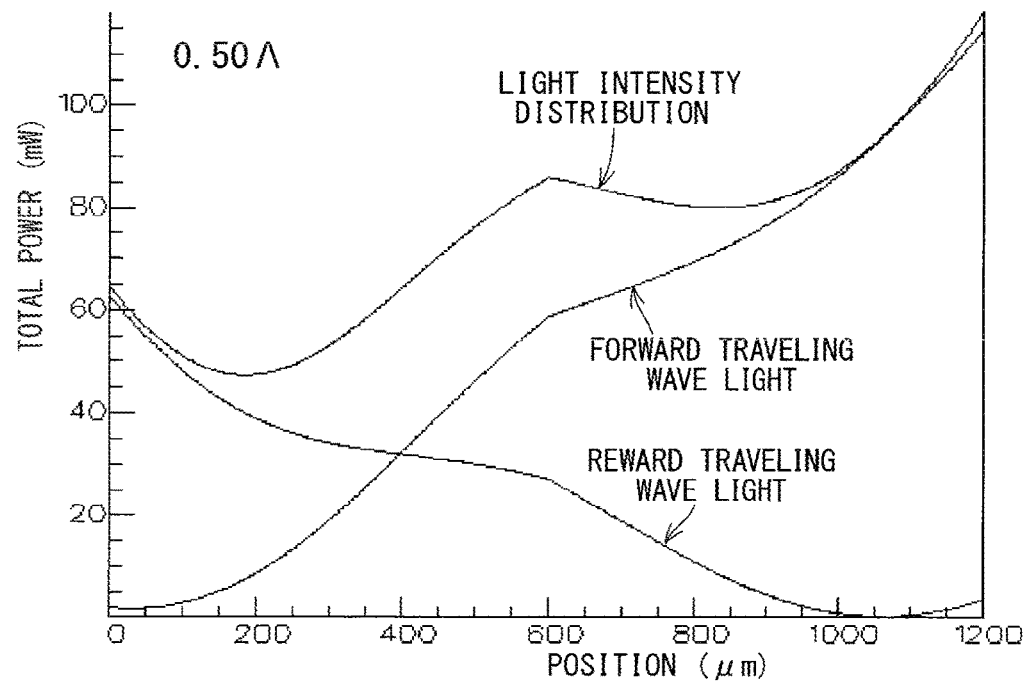
Figure 24A:
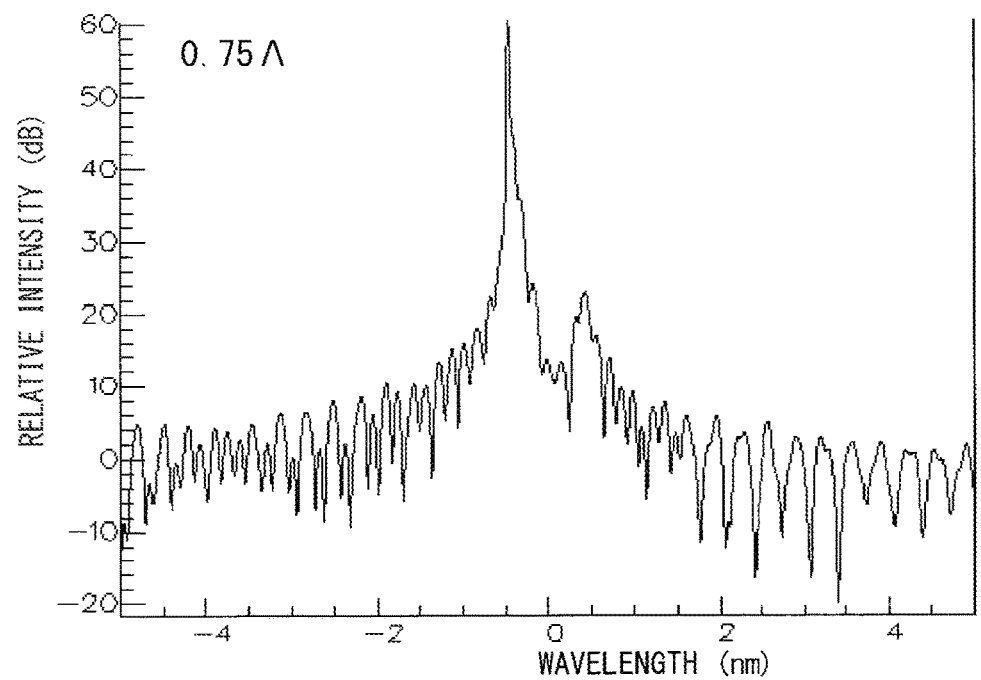
Figure 24B:
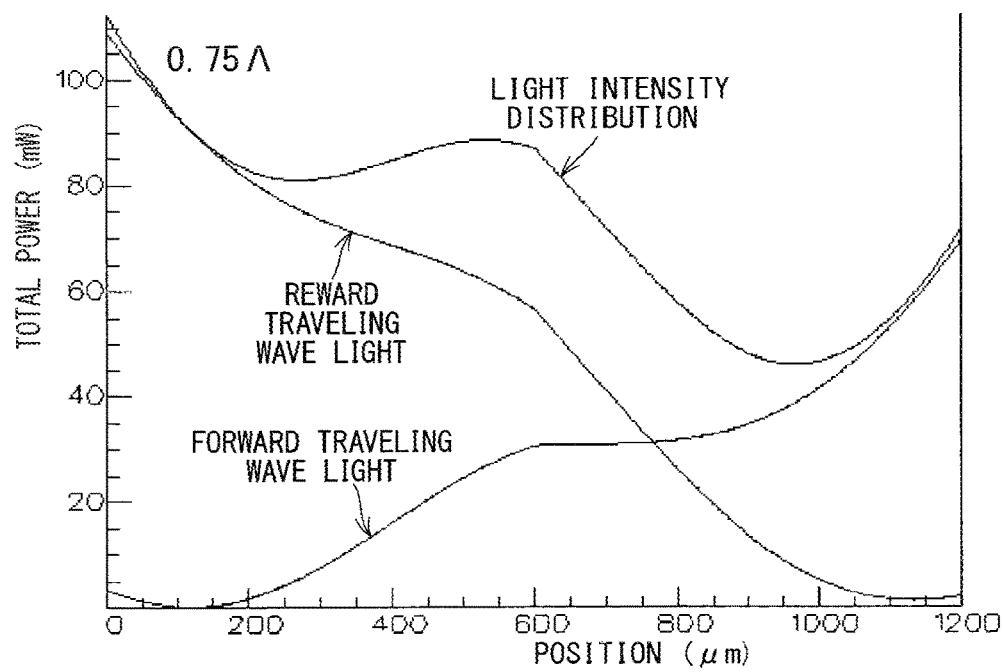
Figure 25A:
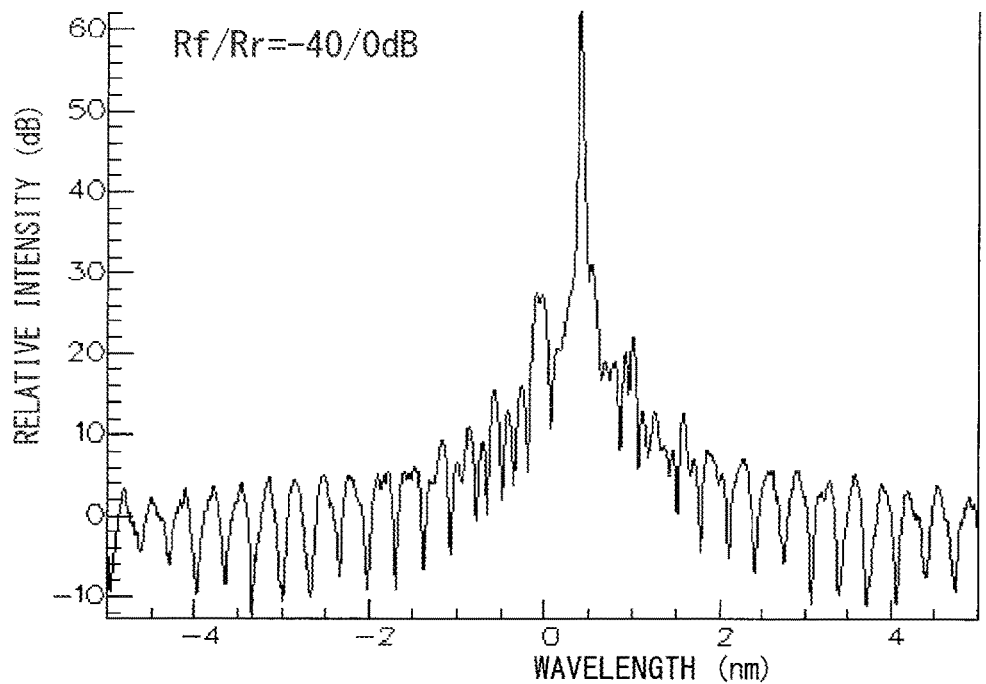
FIGS. 25A, 25B, 26A, 26B, 27A, 27B, 28A, and 28B show oscillation characteristics when reflections from the both end surfaces are asymmetric with each other in the semiconductor laser according to the prerequisite technology.
Figure 25B:
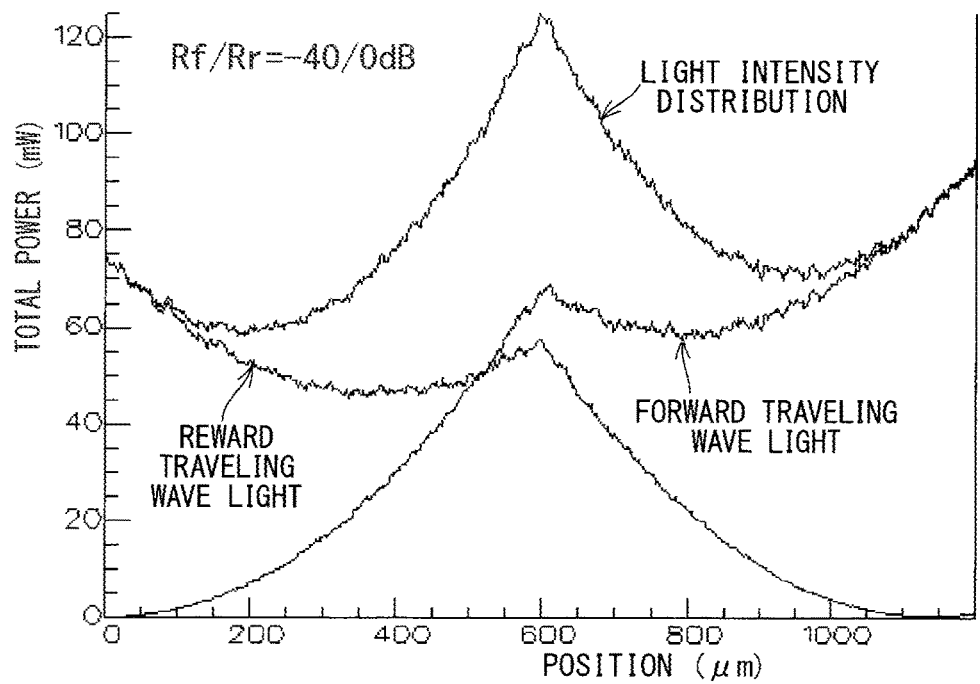
Figure 26A:
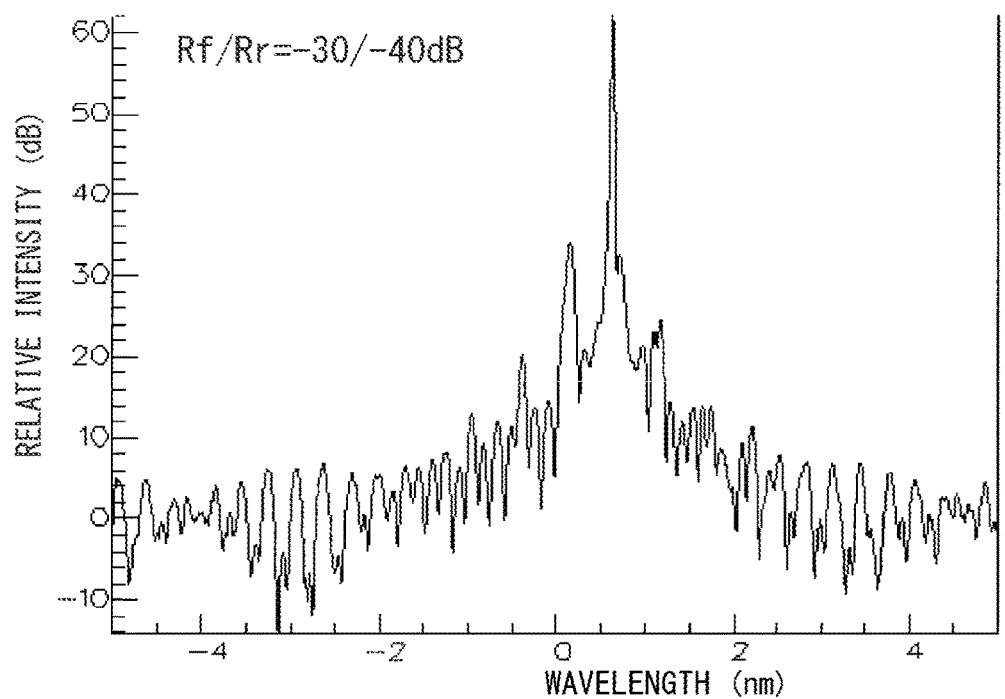
Figure 26B:
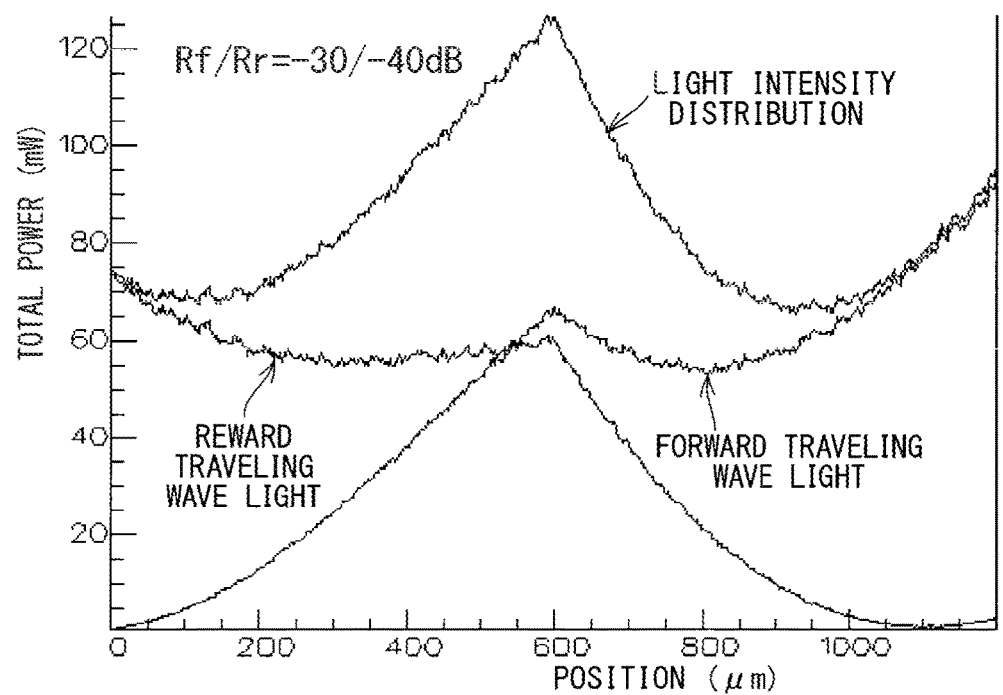
Figure 27A:
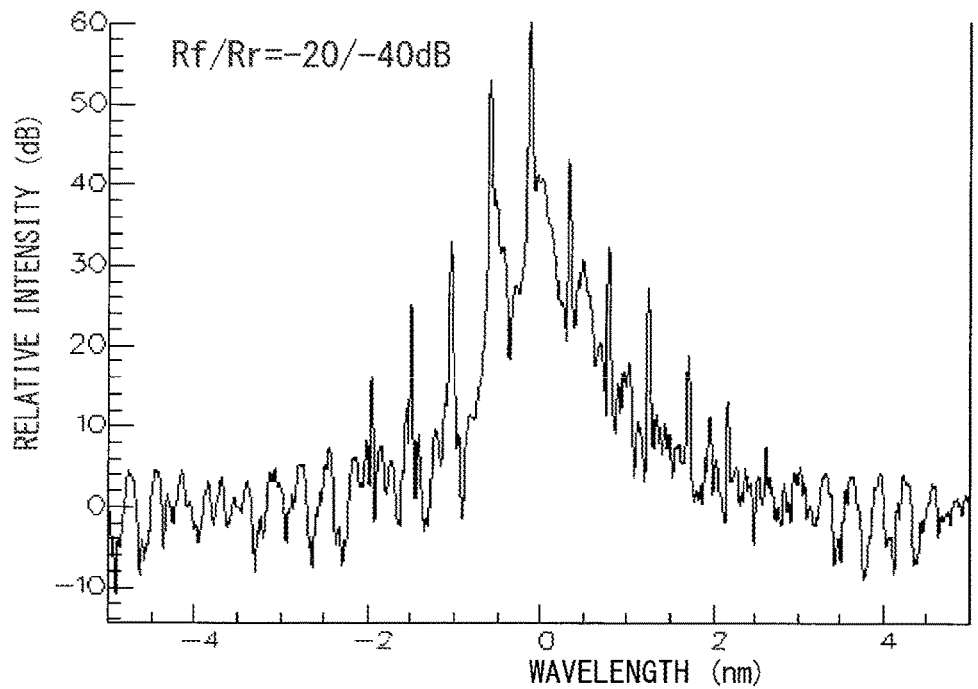
Figure 27B:
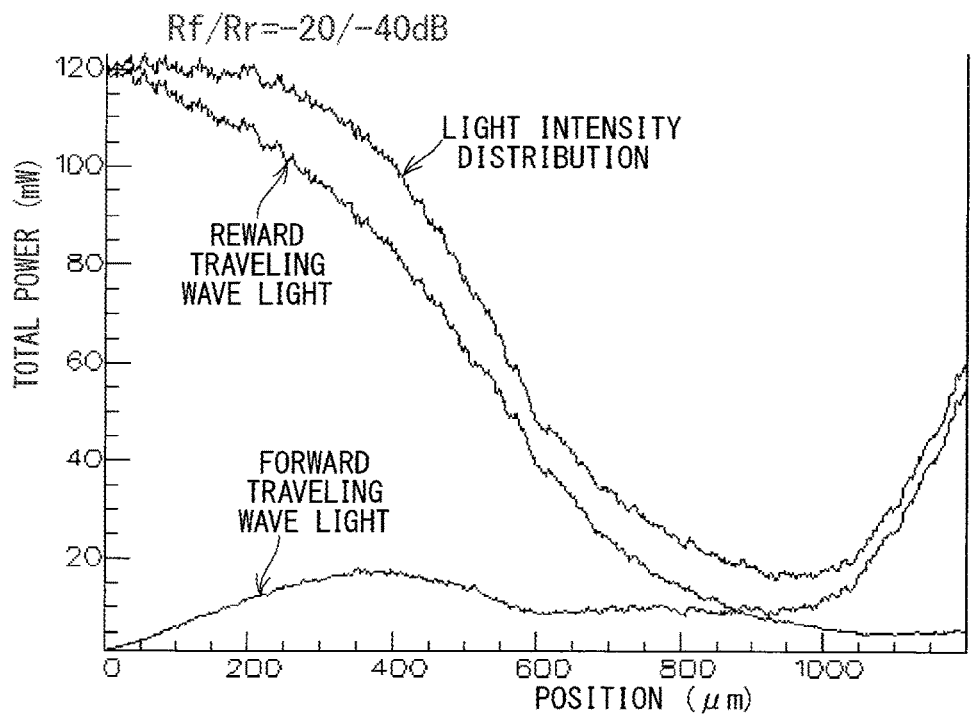

FIG. 20 is a cross-sectional view along a line A-A of FIG. 19. FIG. 20 shows an example configuration of an LD waveguide formed of an InGaAsP material on an InP substrate. FIG. 20 does not show the upper electrode 2 and the lower electrode 3 for simplicity.

The LD waveguide includes an InP lower cladding layer 12, an InP current blocking layer 13 and an InGaAsP active layer 14, an InGaAsP guide layer 15, an InP upper cladding layer 16, and an InGaAsP contact layer 17, which are laminated on an InP substrate 11 in the stated order. The InGaAsP active layer 14 may be a multiple quantum well (MQW) layer or a bulk epitaxial layer.

The following describes the operation of the semiconductor laser in the presence of a reflected return light. FIGS. 21A, 21B, 22A, 22B, 23A, 23B, 24A, and 24B show the dependence of the oscillation characteristics of the semiconductor laser on the phase of an end surface in the prerequisite technology. In FIGS. 21A, 21B, 22A, 22B, 23A, 23B, 24A, and 24B, κ×L is 1.8, L is 1200 μm, and both of the reflections from the front and rear end surfaces are −30 dB, where κ represents the coupling coefficient of a diffraction grating, and L represents the length of the diffraction grating 5.

With reference to FIGS. 21A, 21B, 22A, 22B, 23A, 23B, 24A, and 24B, the position of a one-side end surface is varied within the range including 0 (FIGS. 21A and 21B), 0.25 Λ (FIGS. 22A and 22B), 0.5 Λ (FIGS. 23A and 23B), and 0.75 Λ (FIGS. 24A and 24B), where Λ represents a diffraction grating period. FIGS. 21A, 22A, 23A, and 24A each show an oscillation spectrum with respect to the Bragg wavelength (0 nm). FIGS. 21B, 22B, 23B, and 24B each show a light intensity distribution, with the positions in the resonator (0 to 1200 μm) as parameters. The light intensity distribution is given as a sum of the light intensity distribution of forward traveling wave light and the light intensity distribution of backward traveling wave light. The forward traveling wave light is produced at a minimum coordinate value side and travels toward increasing coordinates while being amplified within the active layer. The backward traveling wave light is produced at a maximum coordinate value side and travels toward decreasing coordinates while being amplified within the active layer.

The light intensity distribution typically tends to peak at the position of the phase shifter. FIGS. 21B, 22B, 23B, and 24B show that the light intensity distribution is shaped variously in accordance with the reflection phase of the end surface, even with a constant reflection amount. For an oscillation spectrum, FIGS. 21A, 22A, 23A, and 24A show that the position of the wavelength of a main peak and the intensity of a sub-peak with respect to the Bragg wavelength change in accordance with the reflection phase of the end surface.

Figure 28A:
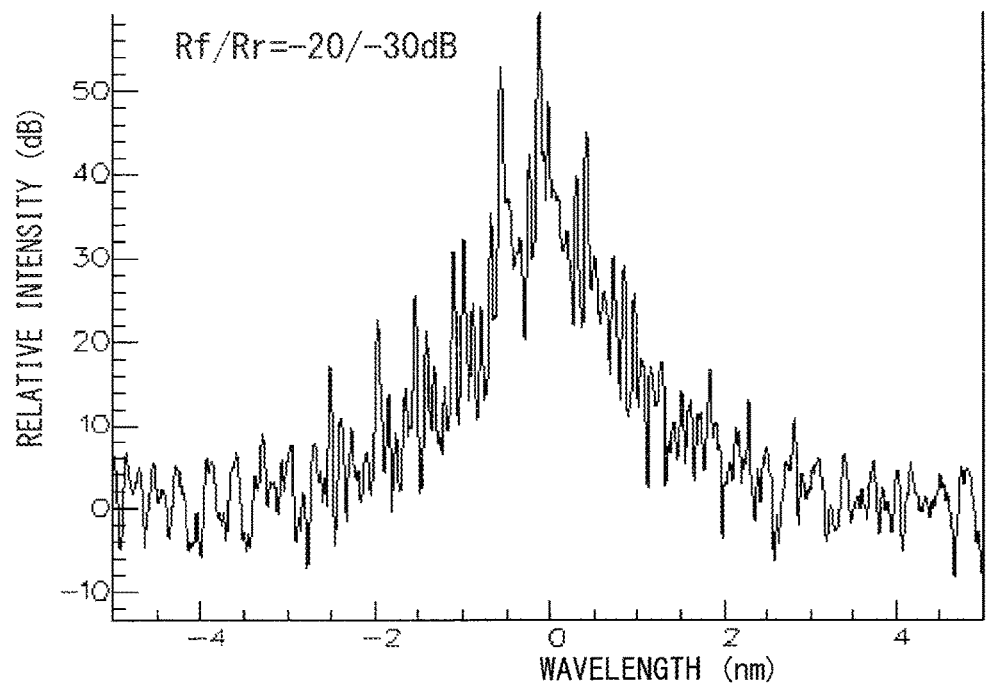
Figure 28B:
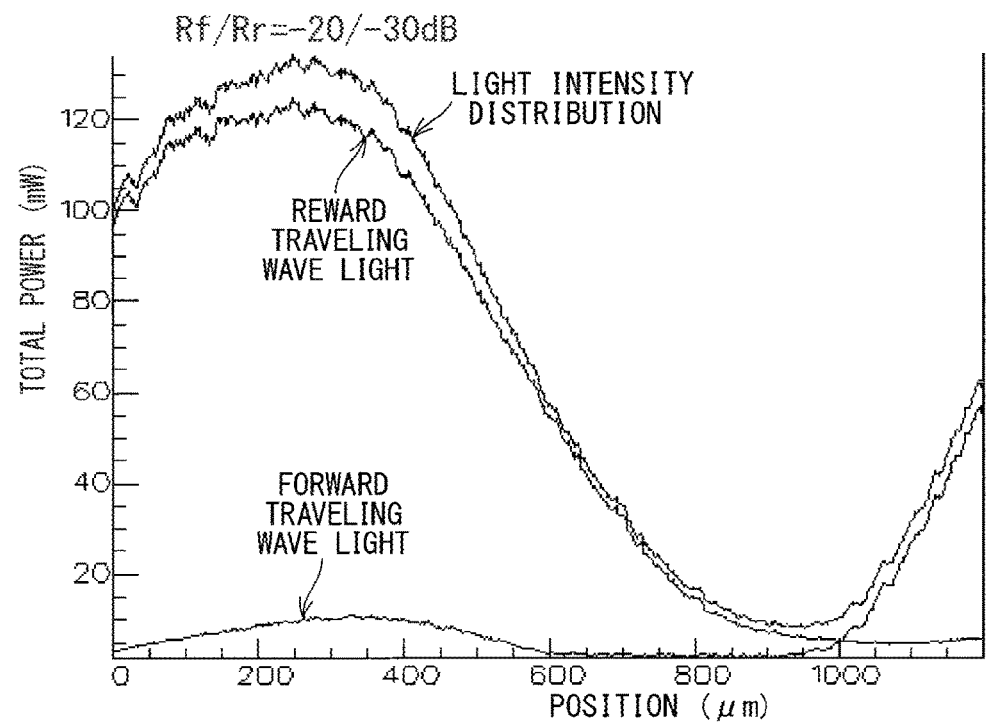

FIGS. 25A, 25B, 26A, 26B, 27A, 27B, 28A, and 28B show laser oscillation characteristics in the case of an asymmetric reflection from the end surface of the semiconductor laser in the prerequisite technology. With reference to FIGS. 25A, 25B, 26A, 26B, 27A, 27B, 28A, and 28B, κ×L is 1.8, and L is 1200 μm. With reference to FIGS. 25A, 25B, 26A, 26B, 27A, 27B, 28A, and 28B, letting Rf [dB] and Rr [dB] be the reflection from the front end surface and the reflection from the rear end surface, respectively, Rf/Rr is −40/0 (FIGS. 25A and 25B), −30/−40 (FIGS. 26A and 26B), −20/−40 (FIGS. 27A and 27B), and −20/−30 (FIGS. 28A and 28B). FIGS. 25A, 26A, 27A, and 28A each show an oscillation spectrum with respect to the Bragg wavelength (0 nm). FIGS. 25B, 26B, 27B, and 28B each show a light intensity distribution, with the positions in the resonator (0 to 1200 μm) as parameters.

FIGS. 27A, 27B, 28A, and 28B show that, when the one-side reflection reaches −20 dB, the spatial asymmetry of the light intensity distribution is intensified, and the oscillation spectrum is obtained in multiple modes, so that the SMSR decreases to 10 dB or lower.

Figure 29A:
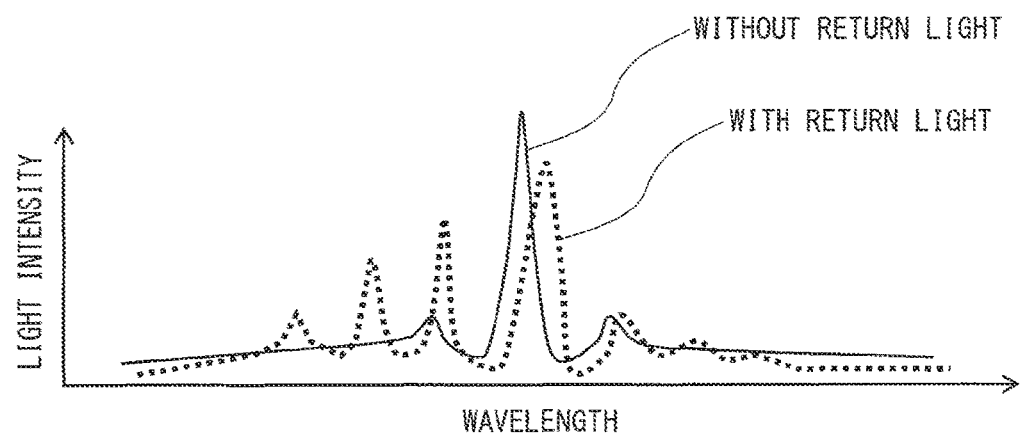
FIGS. 29A, 29B show the dependence of oscillation characteristics of the semiconductor laser according to the prerequisite technology on return light.
Figure 29B:
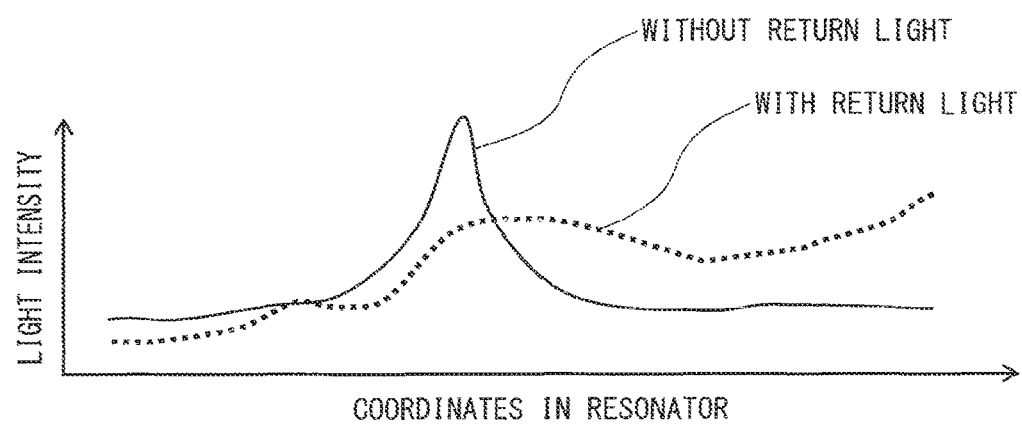

FIGS. 29A and 29B schematically show the oscillation spectrum and the light intensity distribution of the resonator in the semiconductor laser of the prerequisite technology. As shown in FIGS. 21A, 21B, 22A, 22B, 23A, 23B, 24A, and 24B, and FIGS. 25A, 25B, 26A, 26B, 27A, 27B, 28A, and 28B, between in the case with a return light and in the case without a return light, the light intensity distribution in the LD resonator varies greatly, and an SMSR is affected differently. The oscillation spectrum above is differently affected by the phase or the intensity of return light.

The present invention has been made to solve the above-mentioned problem, which is described below in detail in the preferred embodiments.

<First Preferred Embodiment>

Figure 1:
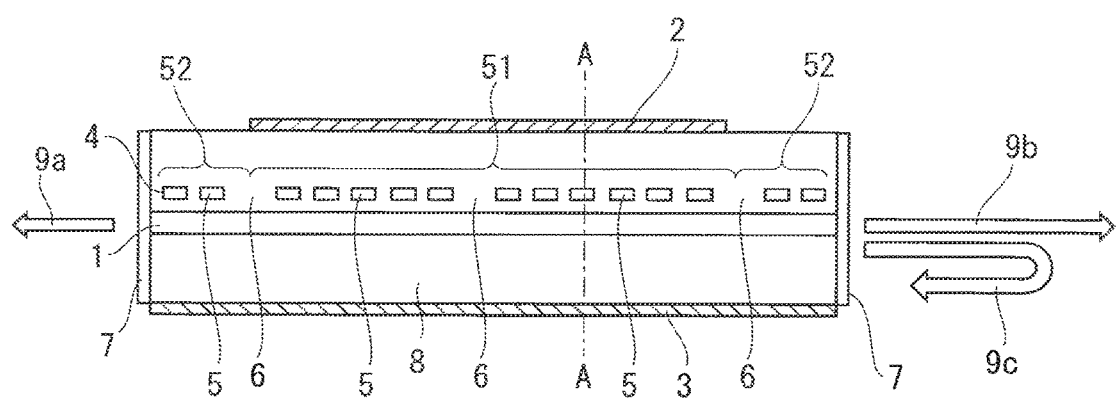
FIG. 1 is a cross-sectional view of a semiconductor laser according to a first preferred embodiment, taken along its longitudinal direction.
Figure 2A:
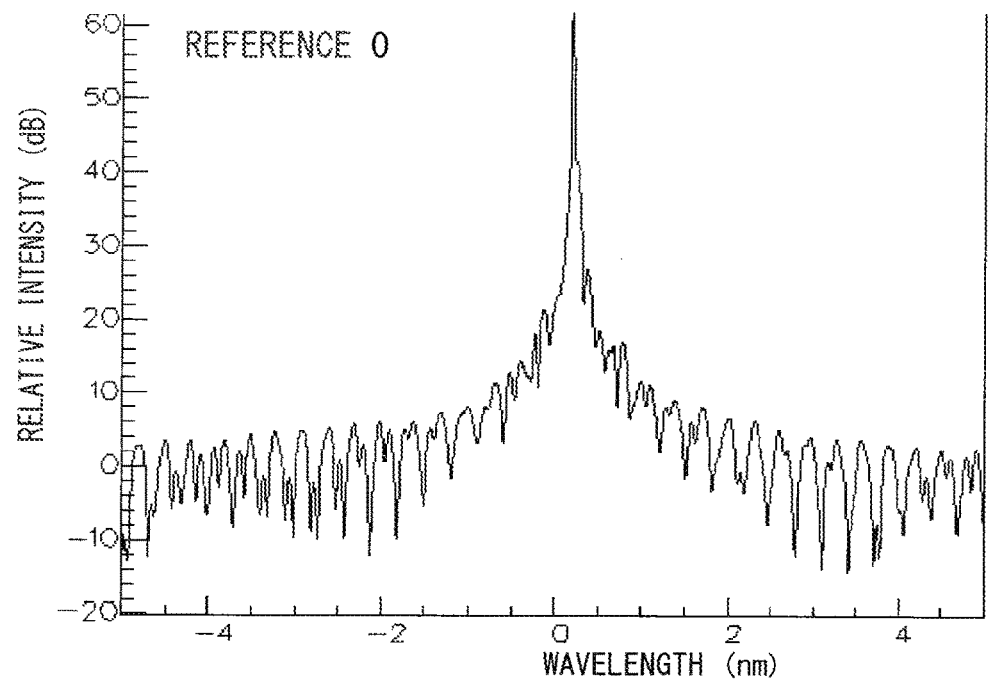
FIGS. 2A, 2B, 3A, 3B, 4A, 4B, 5A, and 5B show the dependence of oscillation characteristics on the phase of an end surface in the presence of reflections from both end surfaces in the semiconductor laser according to the first preferred embodiment.
Figure 2B:
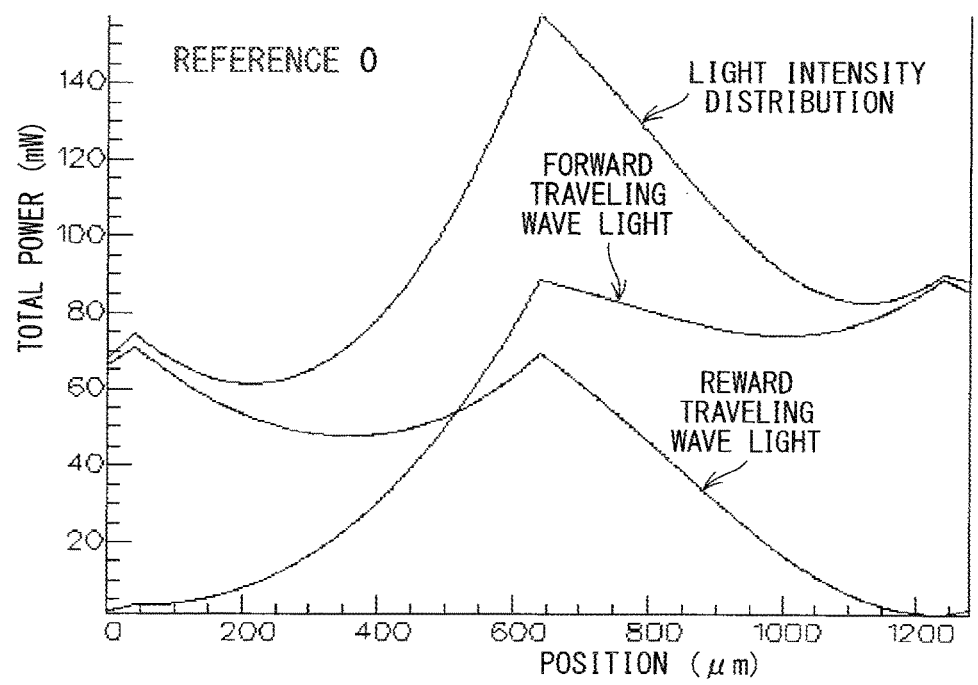
Figure 3A:
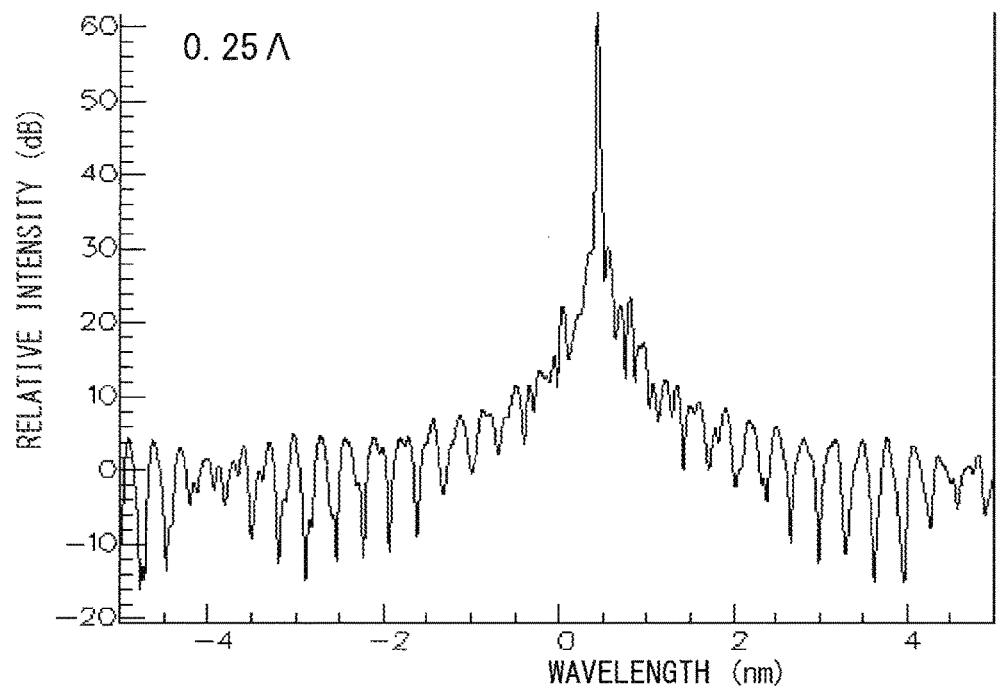
Figure 3B:
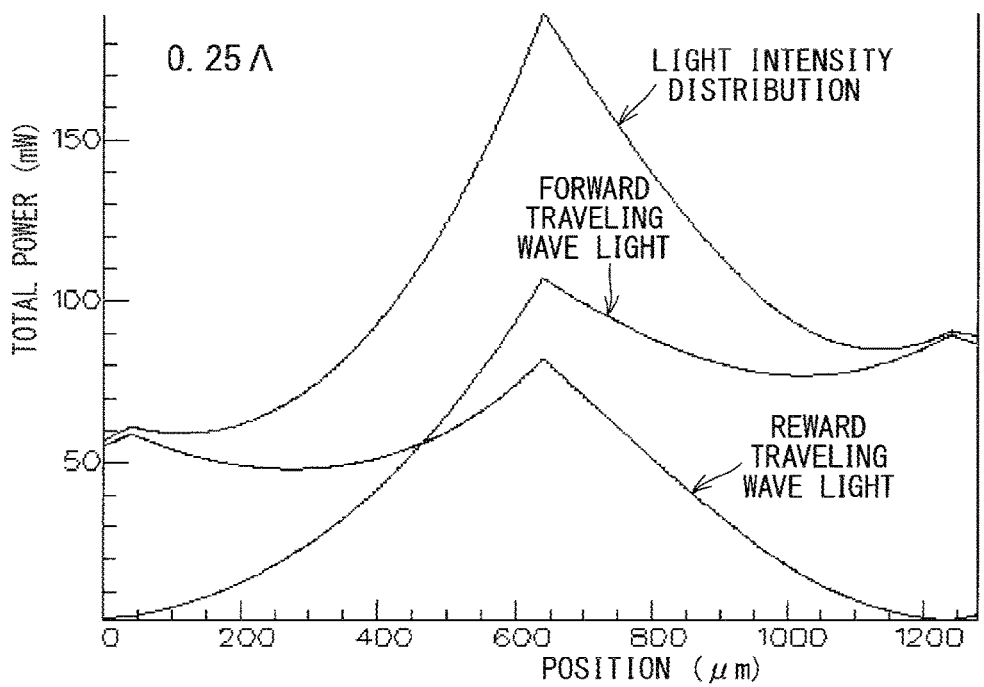
Figure 4A:
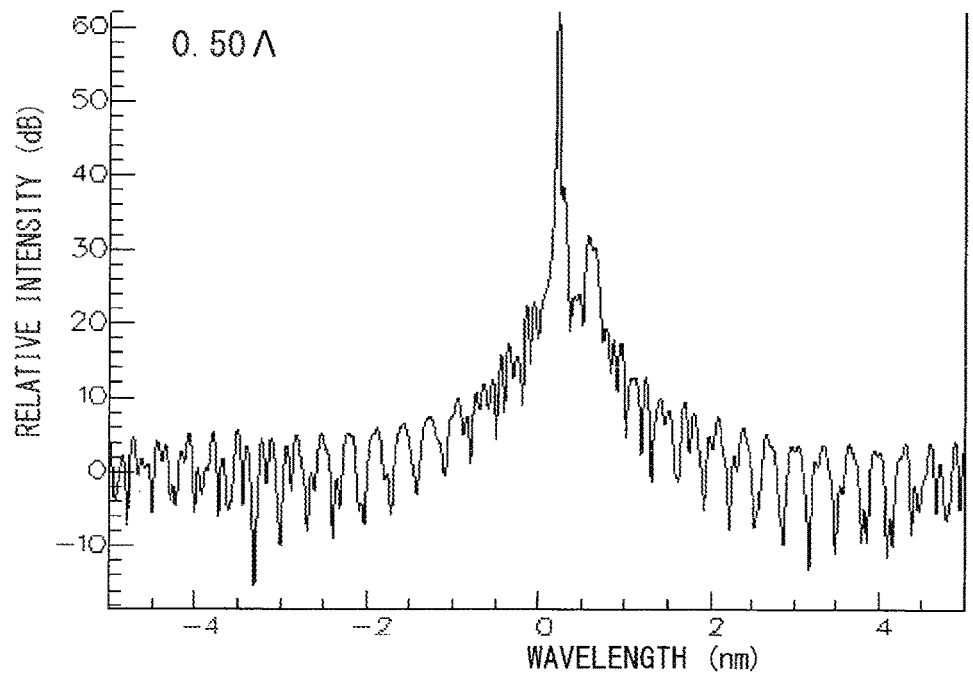
Figure 4B:
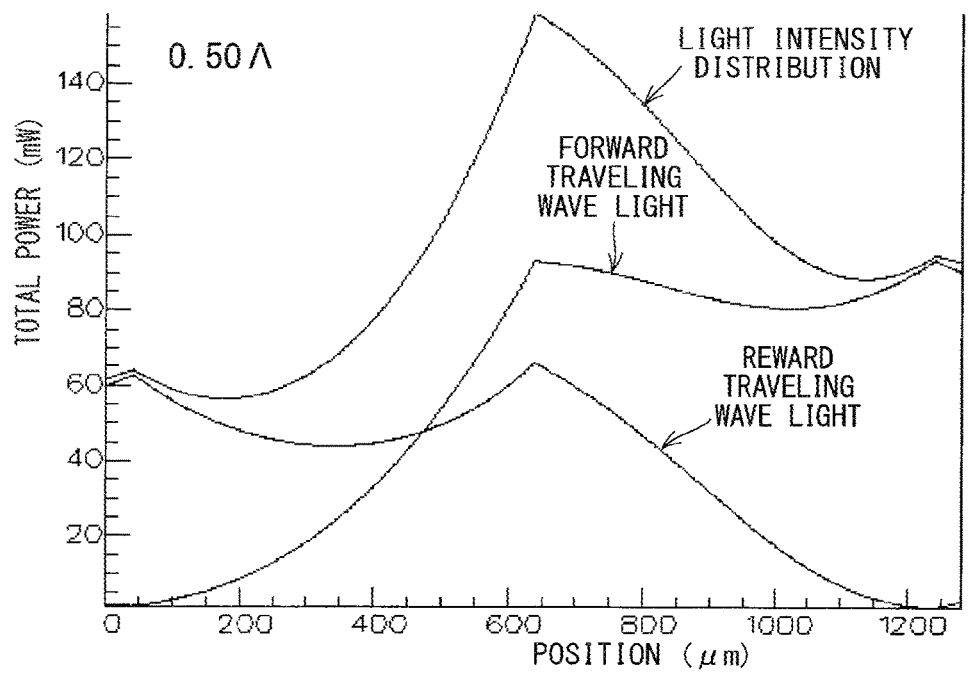
Figure 5A:
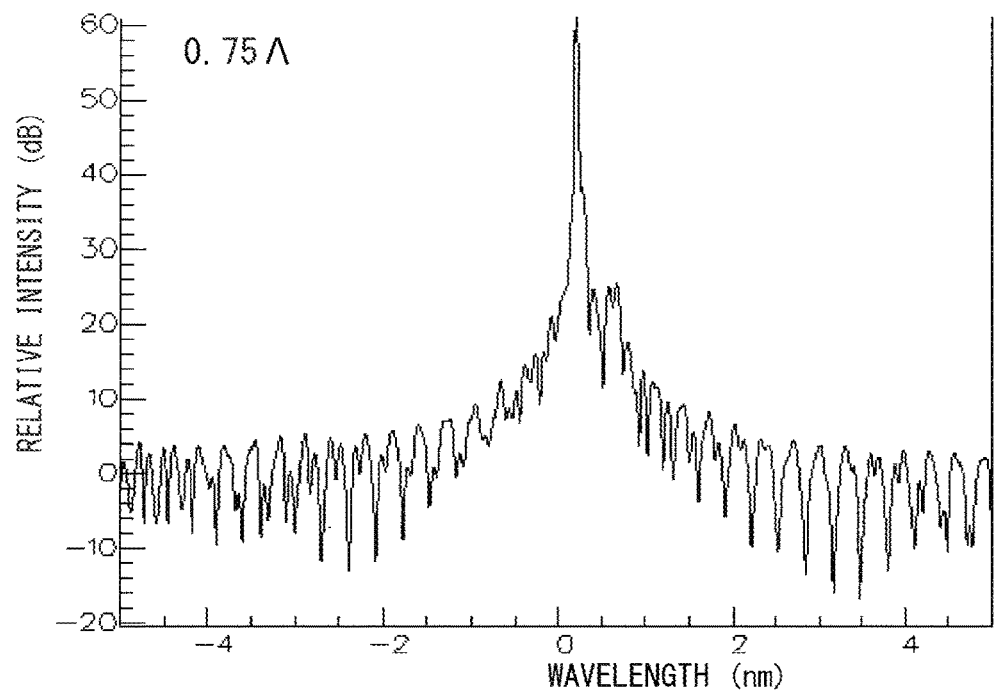
Figure 5B:
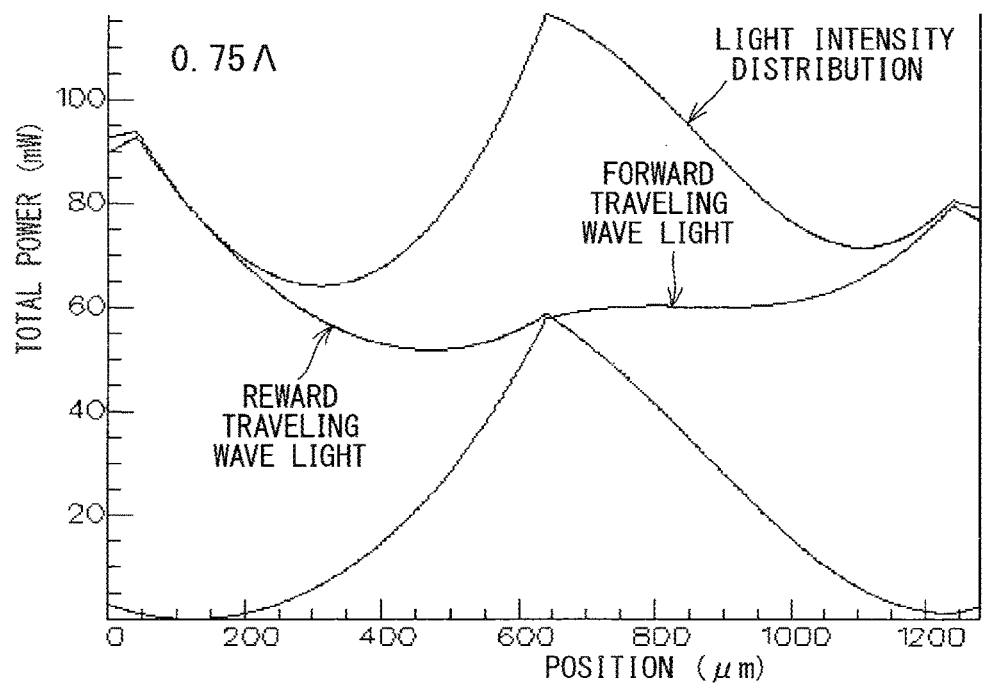
Figure 6A:
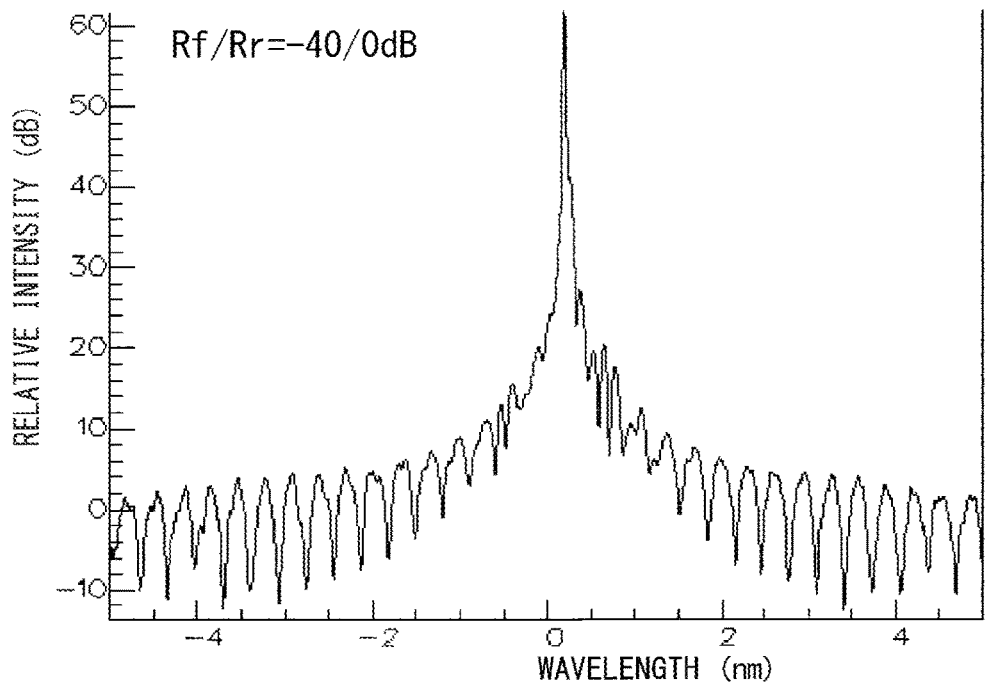
FIGS. 6A, 6B, 7A, 7B, 8A, 8B, 9A, and 9B show oscillation characteristics when reflections from the both end surfaces are asymmetric with each other in the semiconductor laser according to the first preferred embodiment.
Figure 6B:
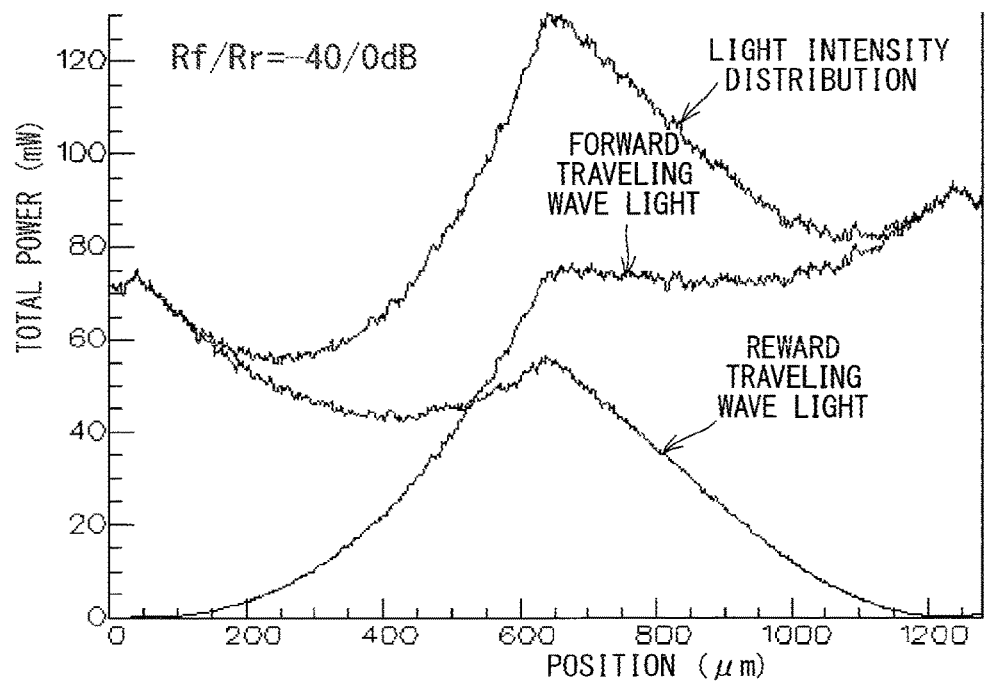
Figure 7A:
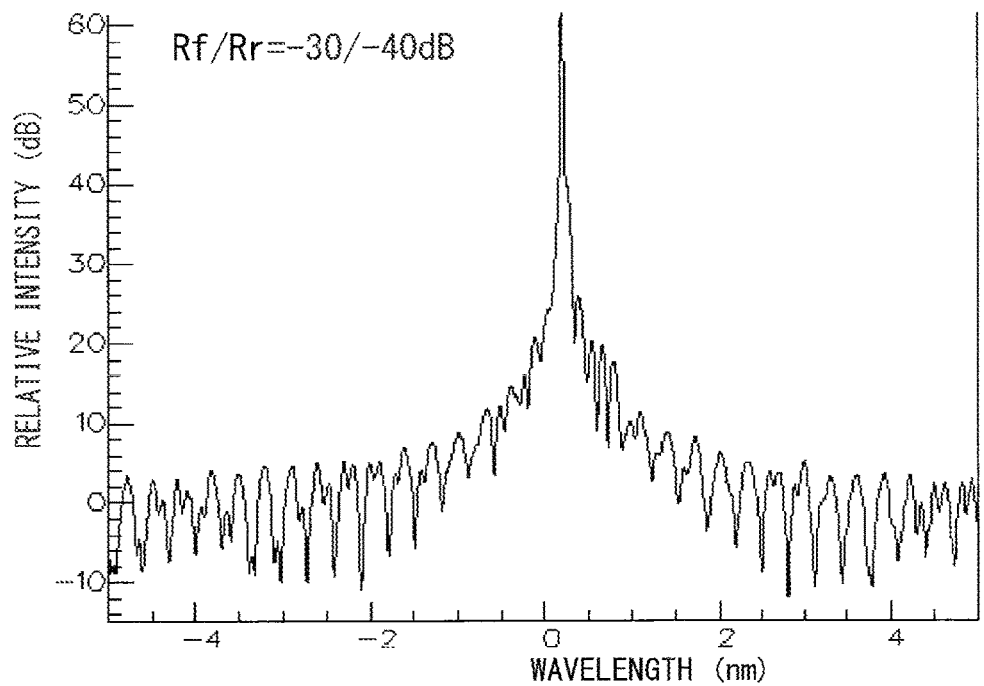
Figure 7B:
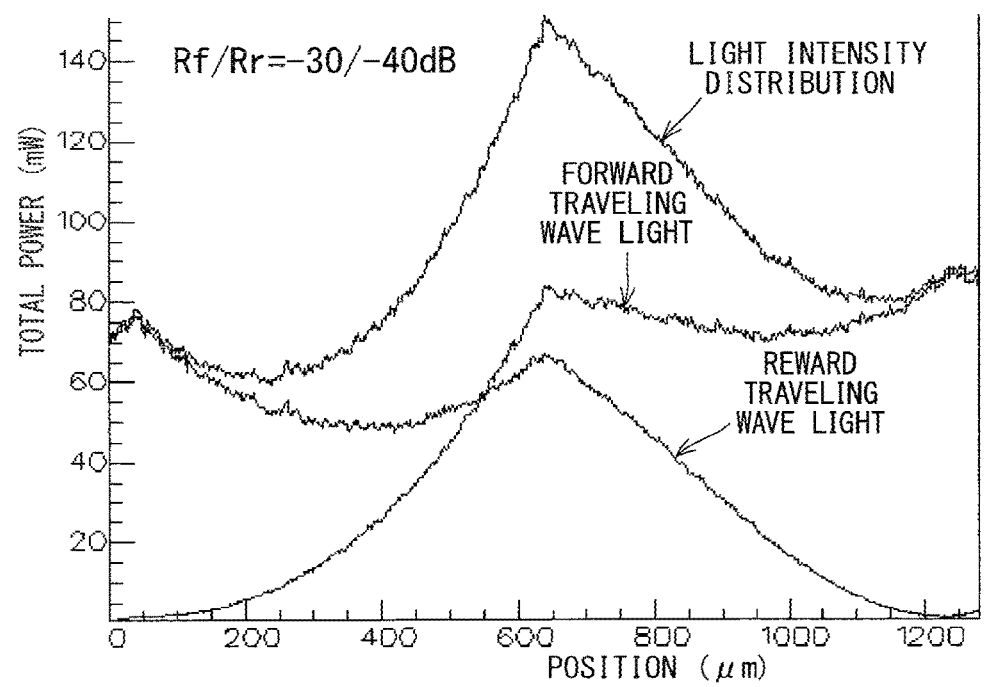
Figure 8A:
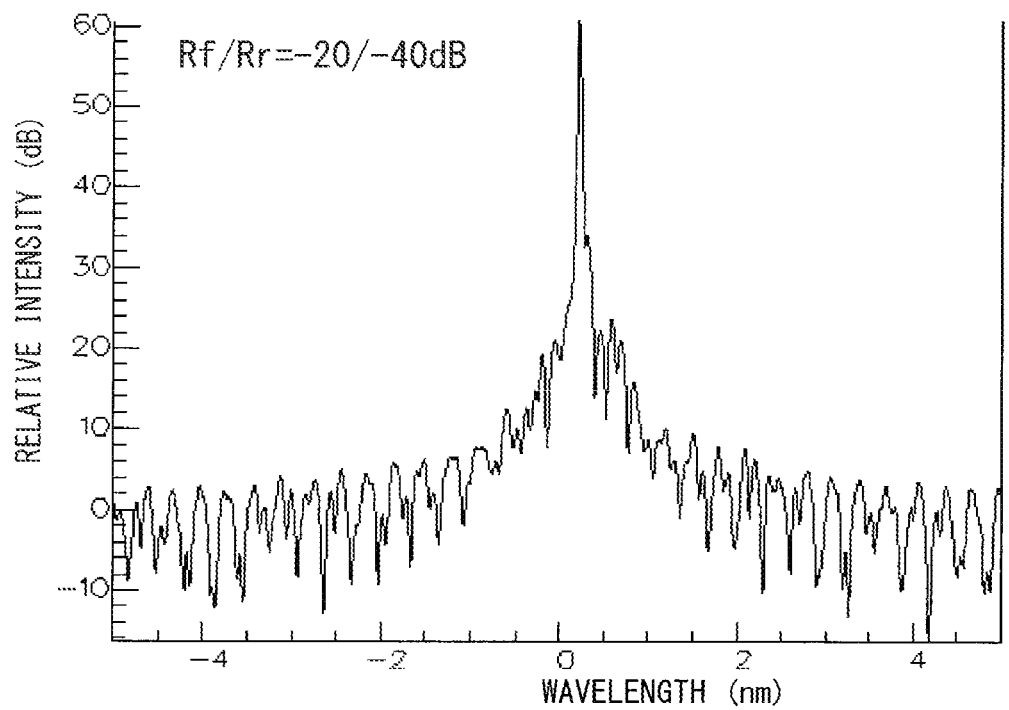
Figure 8B:
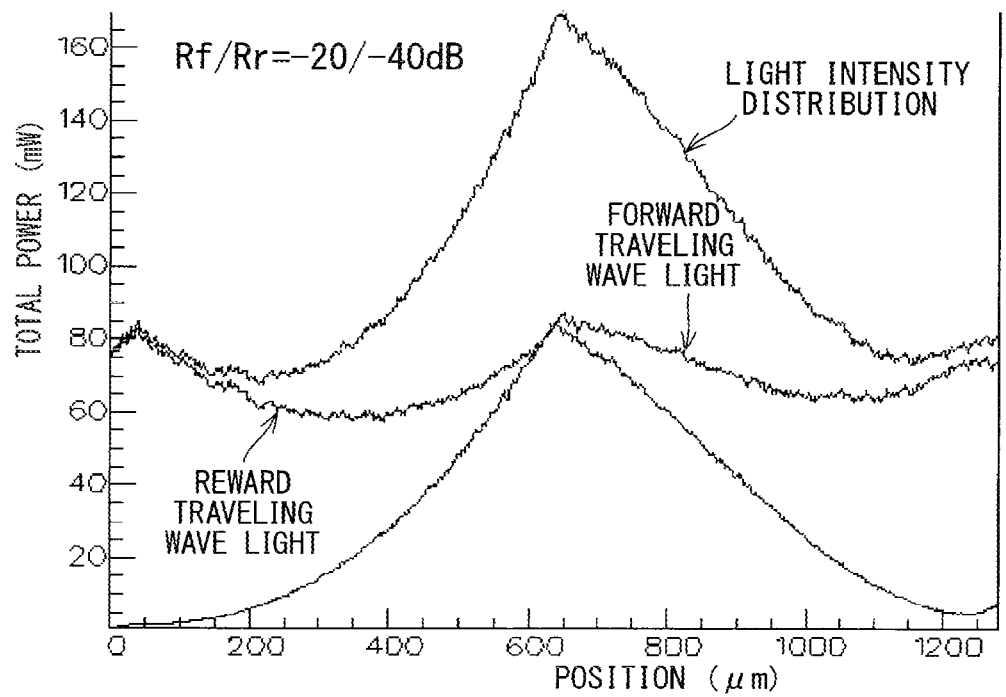
Figure 9A:
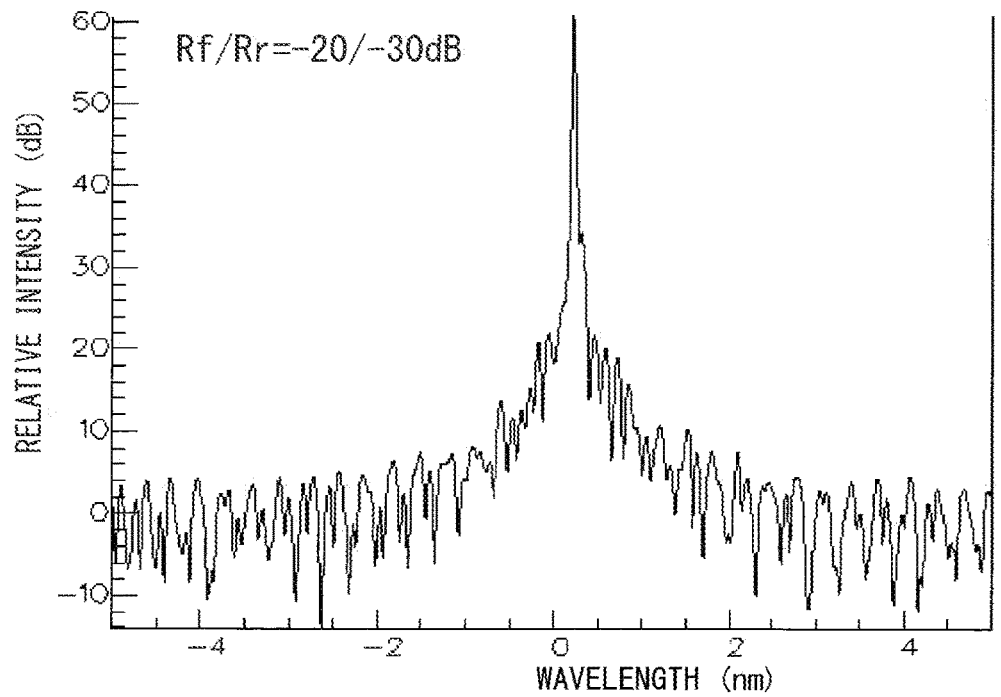
Figure 9B:
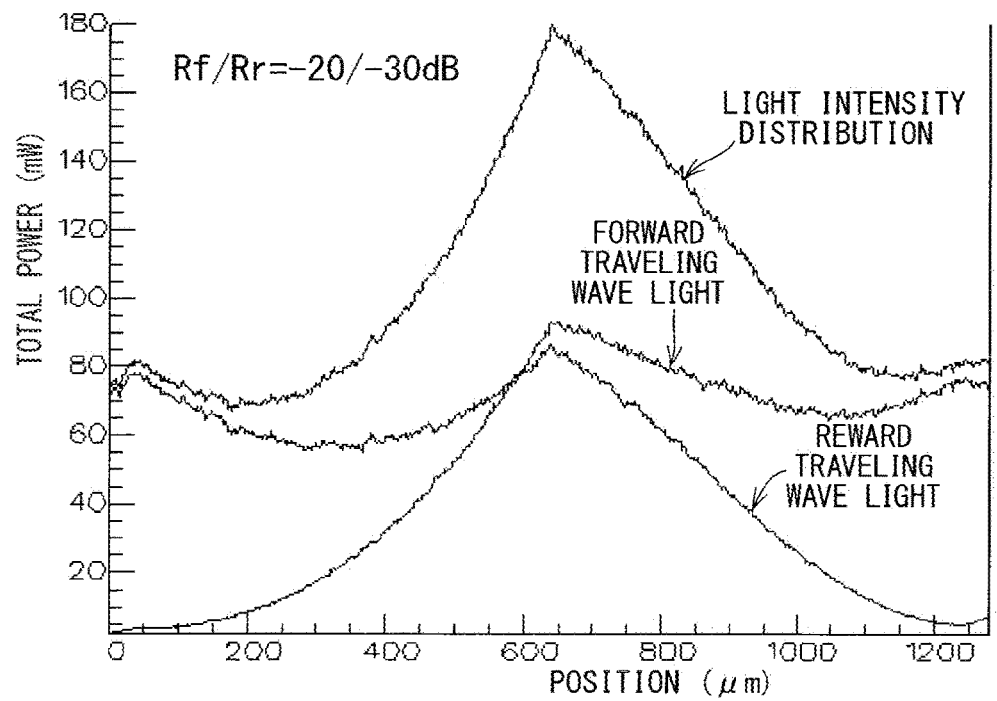
Figure 10A:
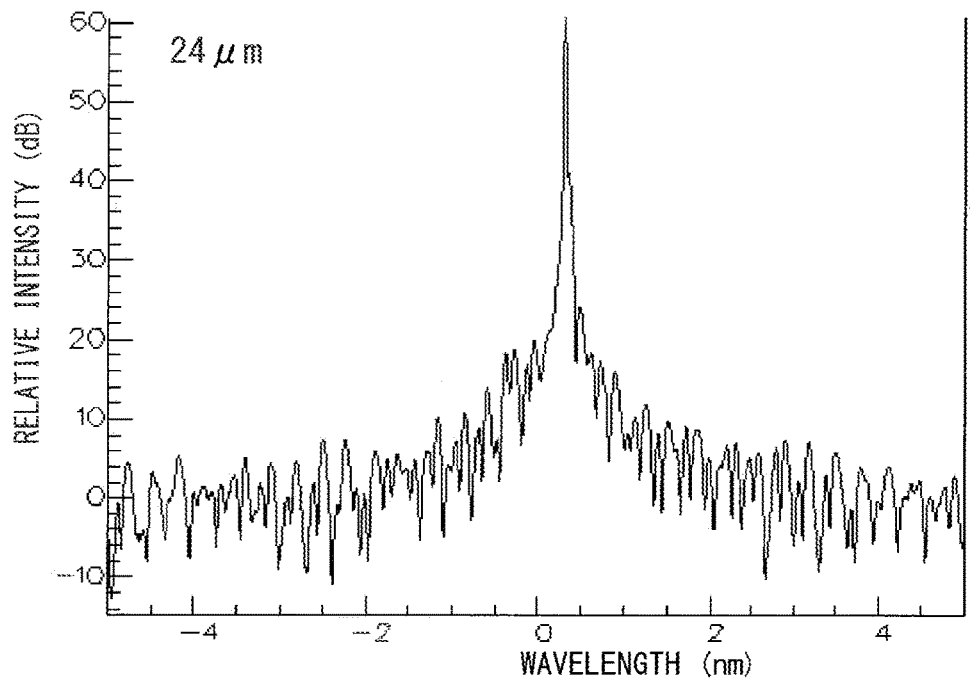
FIGS. 10A, 10B, 11A, 11B, 12A, 12B, 13A, and 13B show the dependence of oscillation characteristics on the phase of an end surface in the presence of reflections from both end surfaces in the semiconductor laser according to the first preferred embodiment.
Figure 10B:
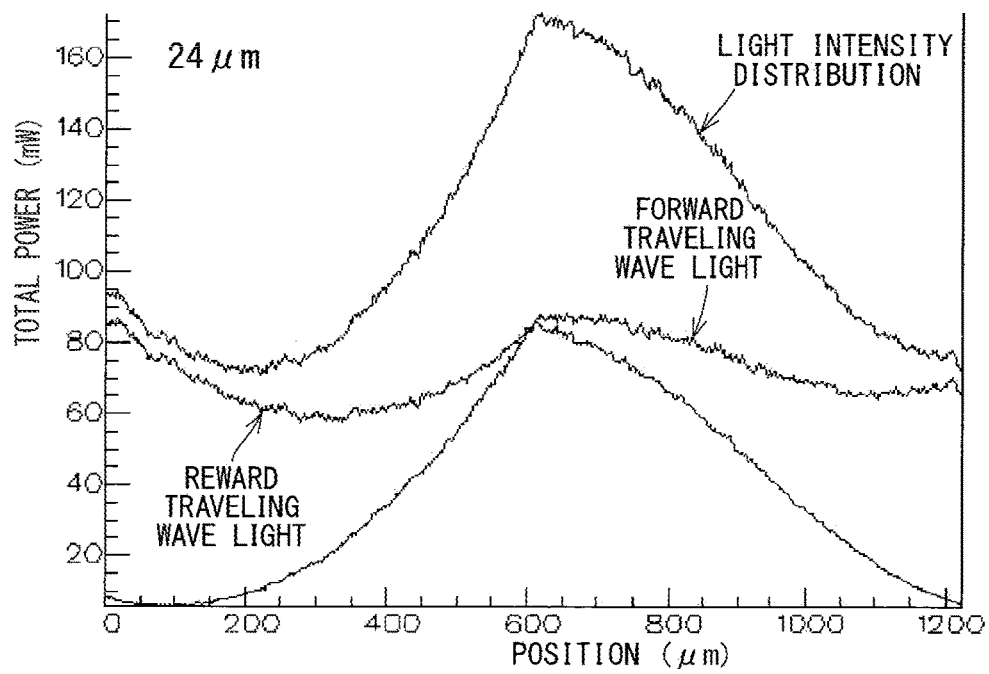
Figure 11A:
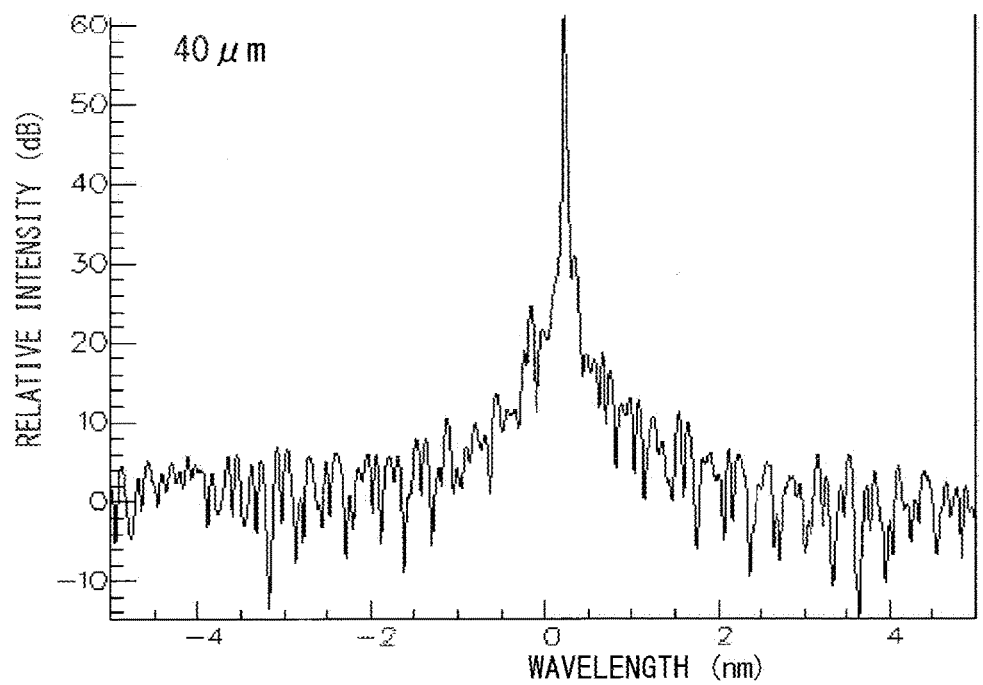
Figure 11B:
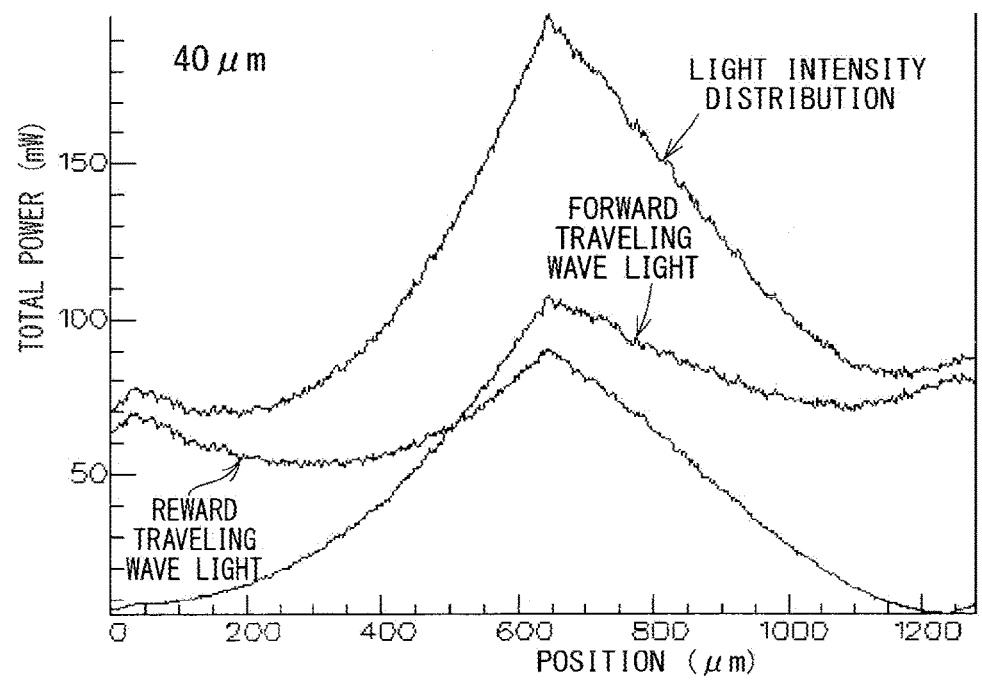
Figure 12A:
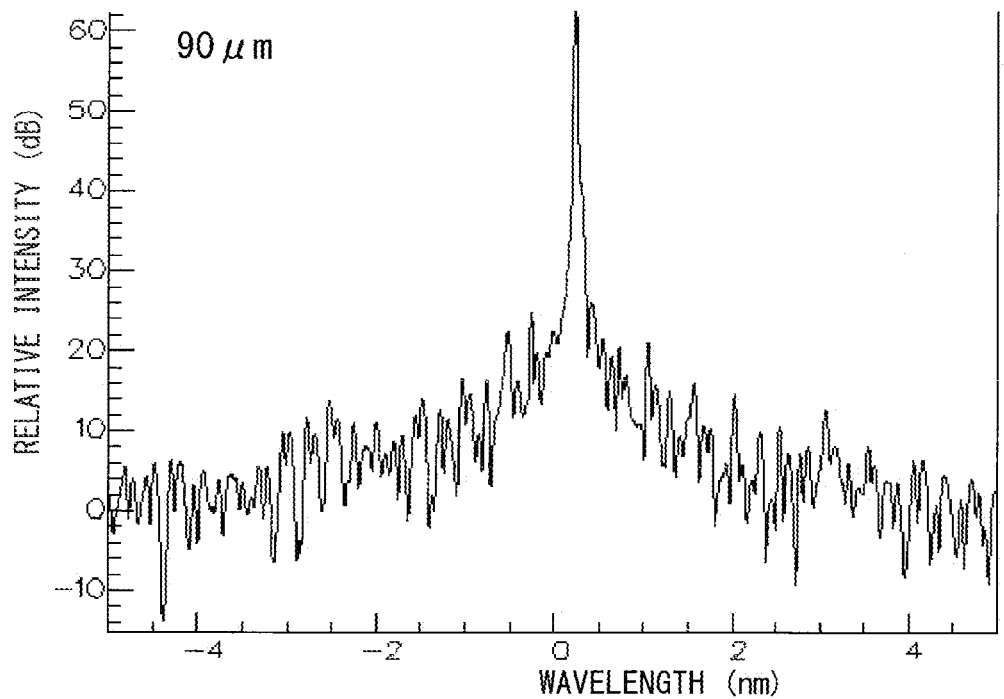
Figure 12B:
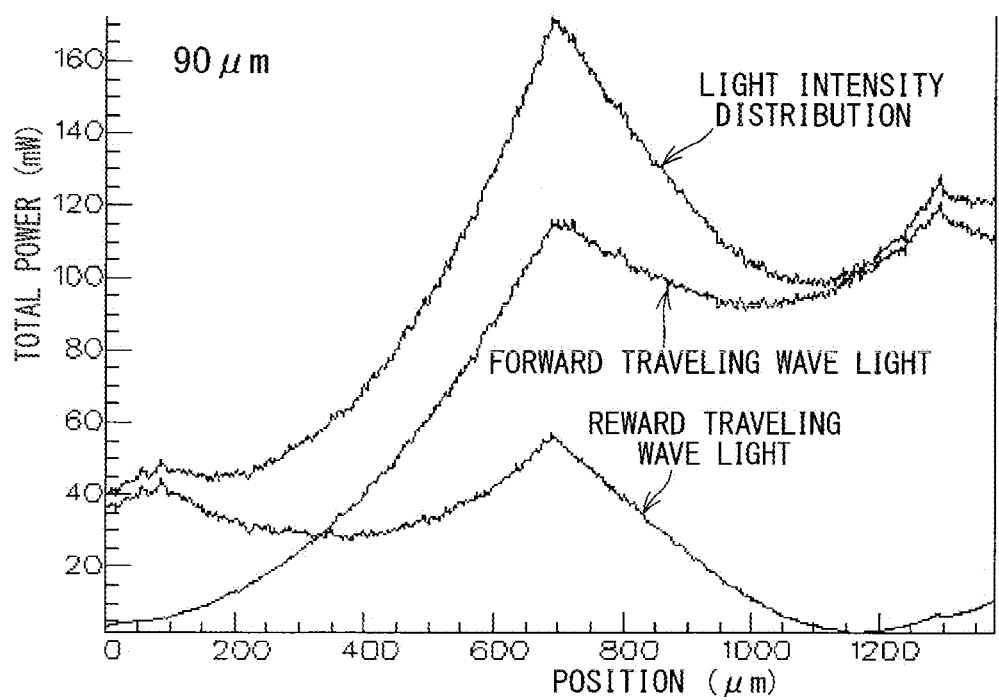

FIG. 1 is a cross-sectional view showing an example configuration of a semiconductor laser according to a first preferred embodiment. In the first preferred embodiment, a diffraction grating 5 includes a current-injection diffraction grating 51 provided in a current injection region and current-non-injection diffraction gratings 52 provided in current non-injection regions. The current-non-injection diffraction gratings 52 are provided both in front of and in back of the current-injection grating 51. The front of the current-injection grating 51 is at the front output light 9b side of the current-injection grating 51. The back of the current-injection grating 51 is at the rear output light 9a side of the current-injection grating 51. An upper electrode 2 is formed in only a portion corresponding to the current-injection diffraction grating 51. Almost no current except for a slight amount of diffusion current flows through the current-non-injection diffraction gratings 52.

In the first preferred embodiment, a phase shifter 6 is provided at the central portion of the current-injection diffraction grating 51. Further, phase shifters 6 are also provided at boundaries between the current-injection diffraction grating 51 and the current-non-injection diffraction gratings 52. For the position of the phase shifter 6, an error equivalent to the carrier diffusion length (2 to 3 μm) is acceptable.

The other components are the same as those of the prerequisite technology (FIG. 19), which are not described here. A cross-sectional view along the line A-A of FIG. 1 is the same as the cross-sectional view (FIG. 20) of the prerequisite technology, which is not described here.

The following describes the operation of the semiconductor laser in the first preferred embodiment in the presence of reflected return light. FIGS. 2A, 2B, 3A, 3B, 4A, 4B, 5A, and 5B show the dependence of oscillation characteristics on the phase of the end surface in the semiconductor laser of the first preferred embodiment. With reference to FIGS. 2A, 2B, 3A, 3B, 4A, 4B, 5A, and 5B, κ×L1 is 1.8, a length L1 of the current-injection diffraction grating 51 is 1200 μm, a length L2 of the current-non-injection diffraction grating 52 is 40 μm (that is, the entire device length is 40 μm+1200 μm+40 μm=1280 μm), each of the phase shifters 6 provided at three positions is a λ/4 phase shifter, and the reflections from both end surfaces are each −30 dB. With reference to FIGS. 2A, 2B, 3A, 3B, 4A, 4B, 5A, and 5B, the position of the one-side end surface is varied within the range including 0 (FIGS. 2A and 2B), 0.25λ (FIGS. 3A and 3B), 0.5λ (FIGS. 4A and 4B), and 0.75λ (FIGS. 5A and 5B), where λ represents a diffraction grating period. FIGS. 2A, 3A, 4A, and 5A each show an oscillation spectrum with respect to the Bragg wavelength (0 nm). FIGS. 2B, 3B, 4B, and 5B each show a light intensity distribution, with the positions in the resonator (0 to 1280 μm) as parameters. The light intensity distribution is defined as in the prerequisite technology.

As shown in each of FIGS. 2B, 3B, 4B, and 5B, the light intensity distribution is maximized at the position of the phase shifter 6 provided at the center of the current-injection diffraction grating 51. The light intensity distribution also has small peaks at the positions of the phase shifters 6 provided at two boundaries between the current-injection diffraction grating 51 and the current-non-injection diffraction gratings 52. The first preferred embodiment differs from the prerequisite technology in that the shape of the light intensity distribution does not change much regardless of the reflection phase of the end surface.

As shown in each of FIGS. 2A, 3A, 4A, and 5A, for an oscillation spectrum, the wavelength position of a main peak and the intensity of a sub-peak are almost constant with respect to the Bragg wavelength. A decrease in light output attributable to the presence of a current non-injection region is almost negligible because the current-non-injection diffraction grating 52 has a short length.

FIGS. 6A, 6B, 7A, 7B, 8A, 8B, 9A, and 9B show laser oscillation characteristics in the case of asymmetric reflections from the end surfaces of the semiconductor laser in the first preferred embodiment. With reference to FIGS. 6A, 6B, 7A, 7B, 8A, and 8B, 9A, and 9B, κ×L1 is 1.8, a length L1 of the current-injection diffraction grating 51 is 1200 μm, a length L2 of the current-non-injection diffraction grating 52 is 40 μm, the phase shifters 6 at three positions each correspond to λ/4, and the reflections from the end surfaces are asymmetric with each other. With reference to FIGS. 6A and 6B, 7A and 7B, 8A and 8B, and 9A and 9B, Rf/Rr is −40/0, −30/−40, −20/−40, and −20/−30, respectively. FIGS. 6A, 7A, 8A, and 9A each show an oscillation spectrum with reference to the Bragg wavelength (0 nm). FIGS. 6B, 7B, 8B, and 9B each show a light intensity distribution, with the positions in the resonator (from 0 to 1280 μm) as parameters.

As shown in FIGS. 6A, 6B, 7A, 7B, 8A, 8B, 9A, and 9B, including the case where the one-side reflection is −20 dB, the shape of the light intensity distribution changes less than that of the prerequisite technology. Specifically, an SMSR does not decrease, and an oscillation spectrum keeps a good single mode.

Figure 13A:
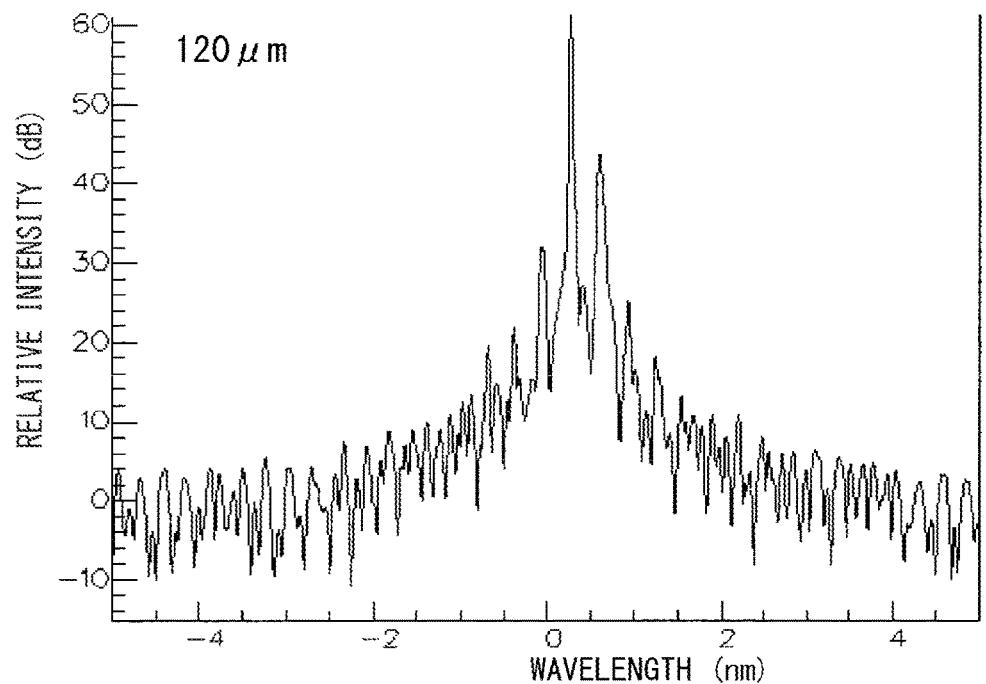
Figure 13B:
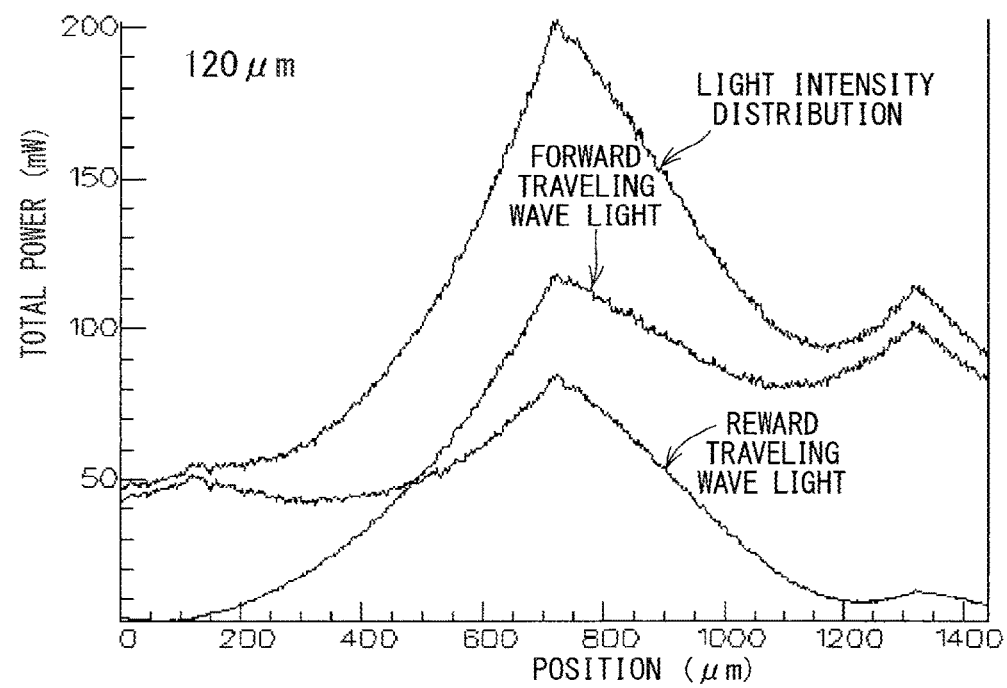

FIGS. 10A, 10B, 11A, 11B, 12A, 12B, 13A, and 13B show the dependence of oscillation characteristics on the length of a current-non-injection diffraction grating in the presence of the reflections from both end surfaces of the semiconductor laser in the first preferred embodiment. FIGS. 9A, 9B, 10A, 10B, 11A, 11B, 12A, 12B, 13A, and 13B show laser oscillation characteristics when κ×L1 of the current-injection diffraction grating 51 is 1.8, L1 of the current-injection diffraction grating 51 is 1200 μm, and the reflections from the both end surfaces are −20 dB, and when a one-side length L2 of the current-non-injection diffraction grating 52 is 24 μm (FIGS. 10A and 10B, 0.036 in terms of κ×L2), 40 μm (FIGS. 11A and 11B, 0/06 in terms of κ×L2), 90 μm (FIGS. 12A and 12B, 0.135 in terms of κ×L2), and 120 μm (FIGS. 13A and 13B, 0.18 in terms of κ×L2).

FIGS. 10A, 11A, 12A, and 13A each show an oscillation spectrum with respect to the Bragg wavelength (0 nm). FIGS. 10B, 11B, 12B, and 13B each show a light intensity distribution, with the positions in the resonator (0 to 1248, 1280, 1380, and 1440 μm, respectively) as parameters.

As shown in FIG. 13A, multiple modes are generated when the one-side length L2 of the current-non-injection diffraction grating 52 is 120 μm. In other cases (FIGS. 10A, 11A, and 12A), that is, when κ×L2 of the current-non-injection diffraction grating 52 is 0.135 or less, an SMSR does not decrease, and an oscillation spectrum keeps a good single mode.

Figure 14A:
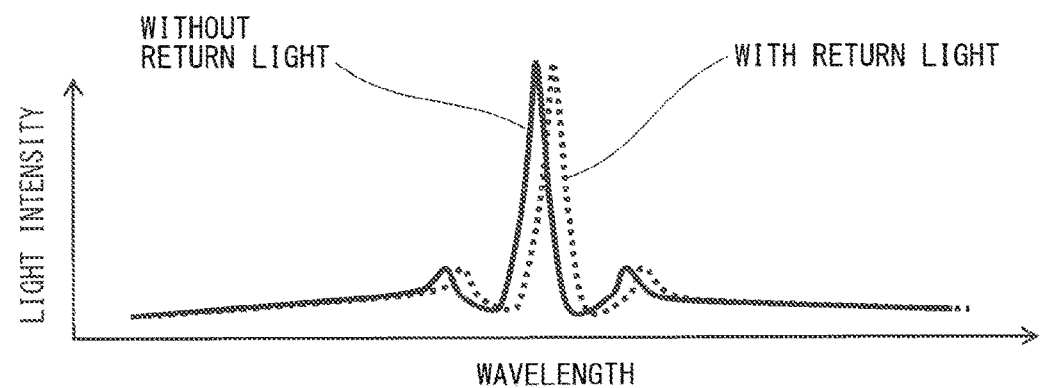
FIGS. 14A and 14B show the dependence of oscillation characteristics of the semiconductor laser according to the first preferred embodiment on return light.
Figure 14B:
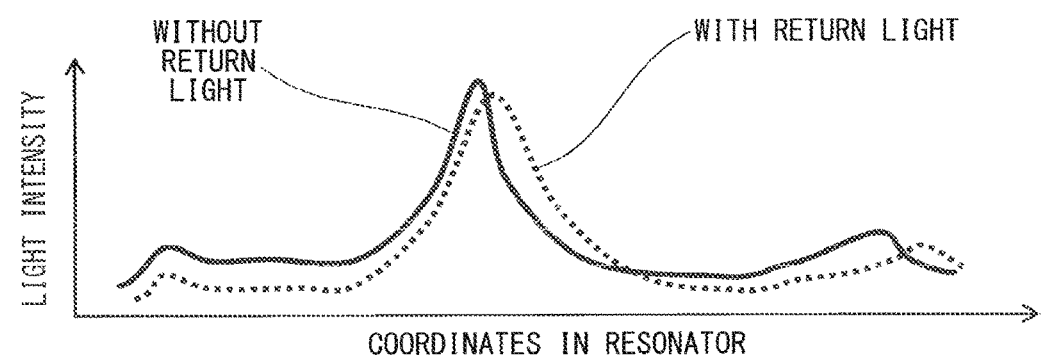

FIGS. 14A and 14B schematically show an oscillation spectrum and a light intensity distribution in the resonator of the semiconductor laser of the first preferred embodiment. The phase shifters 6 at three positions, where optical electric field is intensified, serve as nodes. Thus, the light intensity distribution in the LD resonator changes little regardless of the presence or absence of reflected return light, whereby an oscillation spectrum and an SMSR are not affected.

From the above, the semiconductor laser according to the first preferred embodiment is less affected by reflected return light than the semiconductor laser (that is, λ/4 phase shift DFB-LD) of the prerequisite technology, so that a single-mode LD whose SMSR does not decrease irrespective of the phase or the intensity of the reflected return light can be achieved.

<Effects>

The semiconductor laser of the first preferred embodiment includes the active layer 1, the guide layer 4 laminated on the active layer 1, the diffraction grating 5 formed along the light emission direction in the guide layer 4, the upper electrode 2 provided above the active layer 1 and the guide layer 4, and the lower electrode 3 provided below the active layer 1 and the guide layer 4. The diffraction grating 5 includes the current-injection diffraction grating 51 and the current-non-injection diffraction gratings 52 provided in front of and in back of the current-injection diffraction grating 51. The phase shifters 6 are individually provided at the central portion of the current-injection diffraction grating 51 and at boundaries between the current-injection diffraction grating 51 and the current-non-injection diffraction gratings 52. The upper electrode 2 is provided above the current-injection diffraction grating 51 and is not provided above the current-non-injection diffraction gratings 52.

Thus, the semiconductor laser according to the first preferred embodiment is less affected by reflected return light than the semiconductor laser (that is, λ/4 phase shift DFB-LD) according to the prerequisite technology, so that a single-mode LD whose SMSR does not decrease irrespective of the phase or the intensity of the reflected return light can be achieved.

In the semiconductor laser of the first preferred embodiment, the product of the length (L2) of the current-non-injection diffraction grating 52 and the coupling coefficient (κ) of the diffraction grating is 0.135 or less.

Thus, setting κ×L2 of the current-non-injection diffraction grating 52 to 0.135 or less keeps a single mode in which an SMSR does not decrease and an oscillation spectrum is good irrespective of the presence or absence of a reflected return light.

In the semiconductor laser of the first preferred embodiment, the phase shifter 6 is a λ/4 phase shifter.

Thus, providing a phase shift region (phase shifter) for shifting a diffraction grating phase by π at the central portion of the diffraction grating 5 excites only one oscillation mode that matches the Bragg wavelength in principle. This leads to a high single-mode yield.

In the semiconductor laser of the first preferred embodiment, the both end surfaces of the diffraction grating 5 are cleaved, and the both end surfaces are covered with anti-reflection coatings.

Therefore, an amount of the reflected return light can be reduced by cleaving the both end surfaces of the diffraction grating 5 and covering the both end surfaces with anti-reflection coatings.

<Second Preferred Embodiment>

FIG. 15 is a cross-sectional view showing an example configuration of an optical integrated light source according to a second preferred embodiment. In the optical integrated light source of this preferred embodiment, an optical modulator 19 that modulates the intensity or the phase of the output light is connected to the output side of the semiconductor laser 18 described in the first preferred embodiment. Further, a semiconductor optical amplifier (hereinafter, referred to as SOA) 20 that amplifies the light output from the optical modulator 19 is connected to the output side of the optical modulator 19.

The semiconductor laser 18, the optical modulator 19, and the SOA 20 share the lower electrode 3. The optical modulator 19 may be a Mach Zehnder (MZ) optical modulator or an electroabsorption (EA) optical modulator. An optical modulator active layer 21 differs from the active layer 1 of the LD, whereas an SOA active layer 22 may be in common with the active layer 1. The anti-reflection coating 7 is applied to the rear surface of the semiconductor laser 18 and to the output side of the SOA 20. FIG. 15 does not show a rear output light for simplicity.

Figure 16:
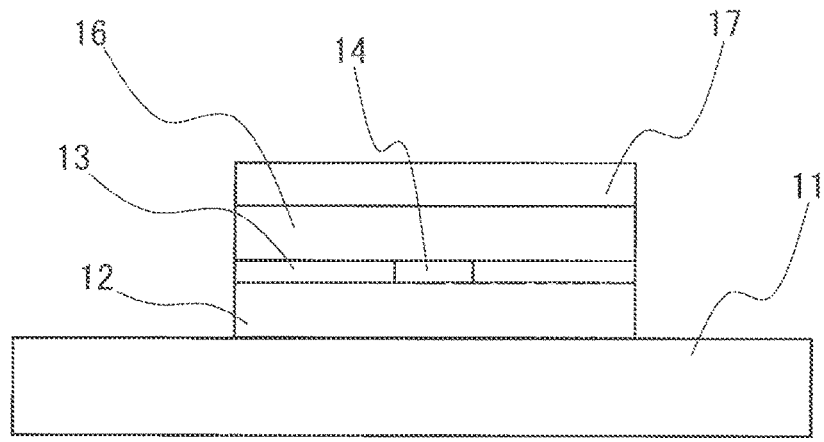
FIG. 16 is a cross-sectional view of a semiconductor optical amplifier (SOA) of the optical integrated device according to the second preferred embodiment.

FIG. 16 is a cross-sectional view along a line B-B of FIG. 15 (that is, a cross-sectional view of the SOA 20 seen from the light emission direction). FIG. 16 shows an example configuration of an LD waveguide, in which the InGaAsP active layer 14 is provided over the InP substrate 11. The cross-sectional view of FIG. 16 differs from that of FIG. 20, which shows the LD waveguide in the prerequisite technology, in that the InGaAsP guide layer 15 is removed. FIG. 16 does not show the upper electrode 2 and the lower electrode 3 for simplicity. The cross-sectional structure of the optical modulator 19 of FIG. 16 is similar to that of FIG. 20 except for the composition of the InGaAsP active layer 14, which is not described here.

The upper electrode 2 is used to drive only the semiconductor laser 18. An optical modulator upper electrode 201 and an SOA upper electrode 202 are independently provided, respectively, to the optical modulator 19 and the SOA 20. A reverse bias voltage can be applied to the optical modulator upper electrode 201 to modulate the light output from the semiconductor laser 18. A forward bias current can be applied to the SOA upper electrode 202 to control the intensity of the front output light 9b. Even if an amount of a forward bias current to be applied to the SOA 20 is increased for higher light output, and consequently, an amount of the reflected return light 9c from the front end surface increases, a stable single mode oscillation can be kept because the semiconductor laser 18 of the present invention is used.

<Effects>

The optical integrated light source of the second preferred embodiment includes the semiconductor laser 18, the optical modulator 19 that is disposed at the output of the semiconductor laser 18 and modulates the intensity or the phase of the light output from the semiconductor laser 18, and the semiconductor optical amplifier 20 that amplifies the light output from the optical modulator 19. The optical integrated light source can control the amplification factor of the semiconductor optical amplifier 20.

As described above, the optical integrated light source of the second preferred embodiment includes the semiconductor laser 18 of the first preferred embodiment. The optical integrated light source of the second preferred embodiment can accordingly be less affected by reflected return light than the optical integrated light source including the semiconductor laser ($\lambda$/4 phase shift DFB-LD) of the prerequisite technology. This can achieve an optical integrated device whose SMSR does not decrease irrespective of the phase or the intensity of the reflected return light and whose light output is high.

<Third Preferred Embodiment>

Figure 17:
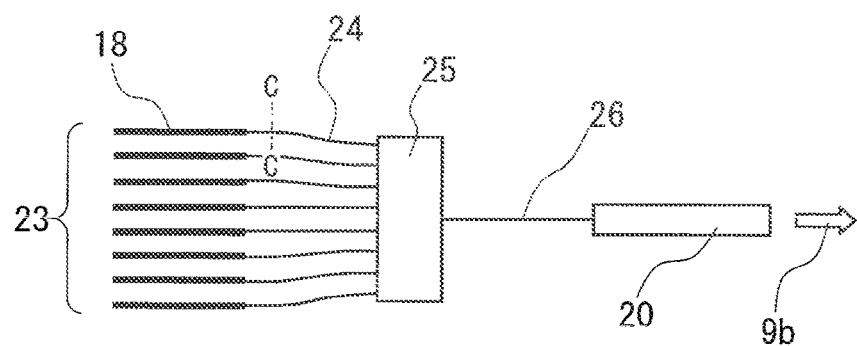
FIG. 17 is a top view of an optical integrated device according to a third preferred embodiment.

FIG. 17 is a top view showing an example configuration of an optical integrated light source according to a third preferred embodiment. The optical integrated light source according to the third preferred embodiment includes a semiconductor laser array 23 including N (N is a natural number of two or more) semiconductor lasers 18 described in the first preferred embodiment. The optical integrated light source further includes MMI input waveguides 24, an MMI 25(N×1–MMI), an MMI output waveguide 26, and an SOA 20 connected to the MMI output waveguide 26.

Independently connected to the SOA 20 is a current injection mechanism (not shown). The SOA 20 is formed by removing a predetermined portion of the MMI output waveguide 26 through etching such that the cross-section of the MMI output waveguide 26 and the cross-section of the SOA 20 are directly bonded to each other by a regrowth technique called butt joint growth.

Figure 18:
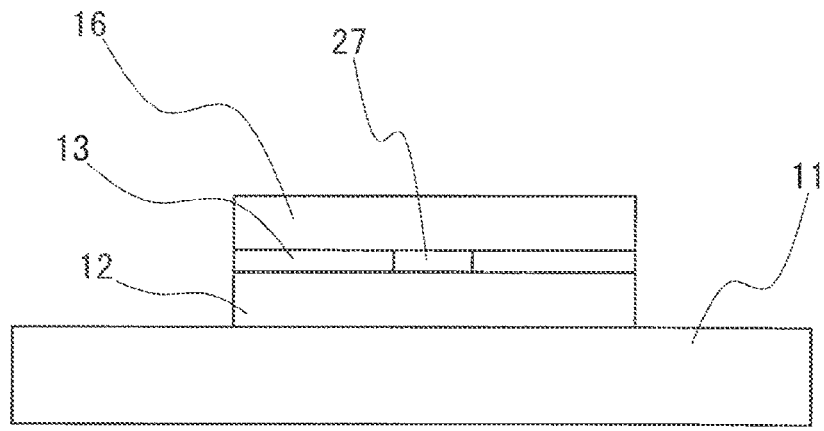
FIG. 18 is a cross-sectional view of an optical waveguide of the optical integrated device according to the third preferred embodiment, seen from an emission direction.

FIG. 18 is a cross-sectional view along a line C-C of FIG. 17 (that is, a cross-sectional view of the MMI input waveguide 24 seen from the emission direction). The configurations of the MMI output waveguide 26 and the SOA 20 are similar to the configurations shown in FIGS. 18 and 16, respectively, which are not described here.

The MMI 25 (N×1–MMI) has an input side and an output side, and is connected at the input to first ends of the N MMI input waveguides 24 and is connected at the output to the MMI output waveguide 26. The MMI 25 multiplexes LD output lights input from the MMI input waveguides 24 and then outputs the combined LD output lights to the MMI output waveguide 26. The N semiconductor lasers 18 are connected to second ends of the MMI input waveguides 24, which can individually produce single-mode oscillations at different wavelengths.

The following describes the operation of the optical integrated light source. Any semiconductor laser 18 is selected to inject a current equal to or larger than a threshold current, so that the selected semiconductor laser 18 produces laser oscillations. The LD output light output from the semiconductor laser 18 is input to a multimode region of the MMI 25 through the MMI input waveguide 24. As long as the MMI 25 is correctly designed, the LD output lights can be coupled in the MMI output waveguide 26 over the entire wavelength range at a ratio of approximately 1/N. When a current is injected to the SOA 20, the LD output light traveling through the MMI output waveguide 26 is amplified, leading to a high light output.

<Effects>

The optical integrated light source according to the third preferred embodiment includes a plurality of semiconductor lasers 18, a plurality of optical waveguides (that is, MMI input waveguides 24) individually connected to outputs of the plurality of semiconductor lasers 18, an optical multiplexing circuit (that is, MMI 25) that is connected to the plurality of optical waveguides and multiplexes laser lights that have propagated through the plurality of optical waveguides, an output waveguide (that is, MMI output waveguide 26) that propagates the light output from the optical multiplexing circuit, and the semiconductor optical amplifier 20 connected to the output waveguide. The optical integrated light source can control the amplification factor of the semiconductor optical amplifier 20.

As described above, the optical integrated light source of the third preferred embodiment includes the semiconductor laser 18 of the first preferred embodiment. The optical integrated light source of the third preferred embodiment can accordingly less affected by reflected return light than the optical integrated light source including the semiconductor laser ($\lambda$/4 phase shift DFB-LD) according to the prerequisite technology. This can achieve an optical integrated device whose SMSR does not decrease irrespective of the phase or the intensity of the reflected return light and whose light output is high.

The embodiments of the present invention can be freely combined or appropriately modified or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor laser, comprising:
an active layer;
a guide layer laminated on said active layer;
a diffraction grating formed along a light emission direction in said guide layer;
an upper electrode provided above said guide layer; and
a lower electrode provided below said active layer, wherein
said diffraction grating includes:
  a current-injection diffraction grating; and
  current-non-injection diffraction gratings provided both in front of and in back of said current-injection diffraction grating,
phase shifters are individually provided at a central portion of said current-injection diffraction grating and at boundaries between said current-injection diffraction grating and said current-non-injection diffraction gratings,
said upper electrode is provided above said current-injection diffraction grating and is not provided above said current-non-injection diffraction gratings, and
a product of a length of one of said current-non-injection diffraction gratings and a coupling coefficient of the one current-non-injection diffraction grating is equal to a product of a length of the other current-non-injection diffraction grating and a coupling coefficient of the other current-non-injection diffraction grating.

2. The semiconductor laser according to claim 1, wherein a product of a length of each of said current-non-injection diffraction gratings and a coupling coefficient of the diffraction grating is 0.135 or less.

3. The semiconductor laser according to claim 1, wherein each one of said phase shifters is a $\lambda/4$ phase shifter.

4. The semiconductor laser according to claim 1, wherein both end surfaces of said diffraction grating are cleaved, and said both end surfaces are covered with anti-reflection coatings.

5. The semiconductor laser according to claim 1, wherein the composition of a portion of said active layer provided under said current-injection diffraction grating is the same as the composition of a portion of said active layer provided under each of said current-non-injection diffraction gratings.

6. An optical integrated light source, comprising:
a semiconductor laser;
an optical modulator that is disposed at an output side of said semiconductor laser and modulates an intensity or a phase of a light output from said semiconductor laser; and
a semiconductor optical amplifier that amplifies the light output from said optical modulator, wherein
said optical integrated light source is capable of controlling an amplification factor of said semiconductor optical amplifier,
said semiconductor laser includes:
  an active layer;
  a guide layer laminated on said active layer;
  a diffraction grating formed along a light emission direction in said guide layer;
  an upper electrode provided above said guide layer; and
  a lower electrode provided below said active layer,
said diffraction grating includes:
  a current-injection diffraction grating; and
  current-non-injection diffraction gratings provided both in front of and in back of said current-injection diffraction grating,
phase shifters are individually provided at a central portion of said current-injection diffraction grating and at boundaries between said current-injection diffraction grating and said current-non-injection diffraction gratings,
said upper electrode is provided above said current-injection diffraction grating and is not provided above said current-non-injection diffraction gratings, and
a product of a length of one of said current-non-injection diffraction gratings and a coupling coefficient of the one current-non-injection diffraction grating is equal to a product of a length of the other current-non-injection diffraction grating and a coupling coefficient of the other current-non-injection diffraction grating.

7. The optical integrated light source according to claim 6, wherein the composition of a portion of said active layer provided under said current-injection diffraction grating is the same as the composition of a portion of said active layer provided under each of said current-non-injection diffraction gratings.

8. An optical integrated light source, comprising:
a plurality of semiconductor lasers;
a plurality of optical waveguides individually connected to outputs of said plurality of semiconductor lasers;
an optical multiplexing circuit that is connected to said plurality of optical waveguides and multiplexes laser lights that have propagated through said plurality of optical waveguides;
an output waveguide that propagates a light output from said optical multiplexing circuit; and
a semiconductor optical amplifier connected to said output waveguide, wherein
said optical integrated light source is capable of controlling an amplification factor of said semiconductor optical amplifier,
each of said plurality of semiconductor lasers includes:
  an active layer;
  a guide layer laminated on said active layer;
  a diffraction grating formed along a light emission direction in said guide layer;
  an upper electrode provided above said guide layer; and
  a lower electrode provided below said active layer,
said diffraction grating includes:
  a current-injection diffraction grating; and
  current-non-injection diffraction gratings provided both in front of and in back of said current-injection diffraction grating,
phase shifters are individually provided at a central portion of said current-injection diffraction grating and at boundaries between said current-injection diffraction grating and said current-non-injection diffraction gratings,
said upper electrode is provided above said current-injection diffraction grating and is not provided above said current-non-injection diffraction gratings, and
a product of a length of one of said current-non-injection diffraction gratings and a coupling coefficient of the one current-non-injection diffraction grating is equal to a product of a length of the other current-non-injection diffraction grating and a coupling coefficient of the other current-non-injection diffraction grating.

9. The optical integrated light source according to claim 8, wherein the composition of a portion of said active layer provided under said current-injection diffraction grating is the same as the composition of a portion of said active layer provided under each of said current-non-injection diffraction gratings.

* * * * *